(12) United States Patent
Matejka et al.

(10) Patent No.: US 8,970,951 B2
(45) Date of Patent: Mar. 3, 2015

(54) MASK INSPECTION MICROSCOPE WITH VARIABLE ILLUMINATION SETTING

(75) Inventors: Ulrich Matejka, Jena (DE); Holger Seitz, Jena (DE); Norbert Rosenkranz, Reichenbach (DE); Mario Laengle, Weimar (DE)

(73) Assignee: Carl Zeiss SMS GmbH, Jena (DE)

( * ) Notice: Subject to any disclaimer, the term of this patent is extended or adjusted under 35 U.S.C. 154(b) by 181 days.

(21) Appl. No.: 13/391,996

(22) PCT Filed: Aug. 28, 2010

(86) PCT No.: PCT/EP2010/005293
§ 371 (c)(1),
(2), (4) Date: Feb. 23, 2012

(87) PCT Pub. No.: WO2011/029535
PCT Pub. Date: Mar. 17, 2011

(65) Prior Publication Data
US 2012/0162755 A1    Jun. 28, 2012

Related U.S. Application Data

(60) Provisional application No. 61/241,565, filed on Sep. 11, 2009.

(30) Foreign Application Priority Data

Sep. 14, 2009  (DE) .......................... 10 2009 041 405

(51) Int. Cl.
*G02B 21/06*     (2006.01)
*G02B 21/08*     (2006.01)
(Continued)

(52) U.S. Cl.
CPC .............. *G02B 21/086* (2013.01); *G02B 5/005* (2013.01); *G03F 1/84* (2013.01)
USPC ............................ 359/386; 359/227; 359/739

(58) Field of Classification Search
USPC .......................... 359/227–236, 385, 386, 739; 356/399–401
See application file for complete search history.

(56) References Cited

U.S. PATENT DOCUMENTS 4,419,013 A * 12/1983 Heimer .......................... 356/400
4,749,278 A *  6/1988 van der Werf ................ 356/401
(Continued)

FOREIGN PATENT DOCUMENTS

DE     195 13 350 A1    10/1995
DE     101 10 597 A1     9/2002
(Continued)

OTHER PUBLICATIONS

International Search Report for PCT/EP2010/005293.
(Continued)

*Primary Examiner* — Frank Font
(74) *Attorney, Agent, or Firm* — Fish & Richardson P.C.

(57) ABSTRACT

During mask inspection it is necessary to identify defects which also occur during wafer exposure. Therefore, the aerial images generated in the resist and on the detector have to be as far as possible identical. In order to achieve an equivalent image generation, during mask inspection the illumination and, on the object side, the numerical aperture are adapted to the scanner used. The invention relates to a mask inspection microscope for variably setting the illumination. It serves for generating an image of the structure (150) of a reticle (145) arranged in an object plane in a field plane of the mask inspection microscope. It comprises a light source (5) that emits projection light, at least one illumination beam path (3, 87, 88), and a diaphragm for generating a resultant intensity distribution of the projection light in a pupil plane (135) of the illumination beam path (3, 87, 88) that is optically conjugate with respect to the object plane. According to the invention, the diaphragm is embodied in such a way that the resultant intensity distribution of the projection light has at least one further intensity value between a minimum and a maximum intensity value.

51 Claims, 9 Drawing Sheets

(51) Int. Cl.
*G02B 5/00* (2006.01)
*G03F 1/84* (2012.01)

(56) References Cited

U.S. PATENT DOCUMENTS

| | | | |
|---|---|---|---|
| 5,568,257 A * | 10/1996 | Ota et al. | 356/490 |
| 5,579,147 A * | 11/1996 | Mori et al. | 359/204.1 |
| 6,586,719 B1 * | 7/2003 | Bartzke et al. | 250/221 |
| 2003/0002022 A1 * | 1/2003 | Schultz | 355/67 |
| 2003/0197923 A1 | 10/2003 | Chuang et al. | |
| 2004/0160591 A1 * | 8/2004 | Wangler et al. | 355/67 |
| 2004/0212793 A1 * | 10/2004 | Koizumi et al. | 355/67 |
| 2007/0122718 A1 | 5/2007 | Mizusako et al. | |

FOREIGN PATENT DOCUMENTS

| | | |
|---|---|---|
| DE | 102008049365 A1 | 4/2010 |
| EP | 1596239 A2 | 11/2005 |
| WO | WO2010/034433 | 4/2010 |

OTHER PUBLICATIONS

German Search Report for 10 2009 041 405.3.

* cited by examiner

MASK INSPECTION MICROSCOPE WITH VARIABLE ILLUMINATION SETTING

This application is the National Stage of International Application PCT/EP2010/005293, filed on Aug. 28, 2010, which claims priority to German Application 10 2009 041 405.3, filed on Sep. 14, 2009 and U.S. Provisional Patent Application 61/241,565, filed on Sep. 11, 2009. The contents of the above applications are incorporated by reference in their entireties.

This patent specification relates to a mask inspection microscope for generating an image of the structure of a reticle arranged in an object plane in a field plane of the mask inspection microscope, comprising a light source that emits projection light, at least one illumination beam path, and a diaphragm, arranged in a pupil plane of the mask inspection microscope, for generating a resultant intensity distribution of the projection light in a pupil plane of the illumination beam path that is optically conjugate with respect to the object plane.

This patent specification additionally relates to a diaphragm for use in a pupil plane of a mask inspection microscope, and to a method for producing a suitable diaphragm.

In lithography for producing semiconductor components, the structures of reticles (which are also referred to synonymously as mask) are projected onto wafers coated with a light-sensitive layer, the resist. In the case of mask inspection microscopes, the structure of a reticle is projected onto a light-sensitive spatially resolved detector such as, for example, a CCD chip (charge coupled device). In this case, the structure is magnified by a factor of 150, for example, in order more accurately to identify structure defects possibly present. During projection onto the wafer, the structure is imaged in demagnified fashion; in current apparatuses, the structure is usually demagnified by a factor of four.

Since, during mask inspection, defects which also occur during wafer exposure are predominantly of interest, the aerial images generated in the resist and on the detector have to be as far as possible identical, apart from the different imaging scale. In order to achieve an equivalent image generation, during mask inspection the wavelength used, the illumination and, on the object side, the numerical aperture are adapted to the scanner used.

A further form of mask inspection microscopes serves for measuring the reticles and is also referred to as a registration tool. The positions of special markers ("registration pattern") or of features of the structure of the reticle, such as e.g. the position of specific edges, are determined. The illumination is used by the stated conventional and off-axis illumination settings for optimizing the contrast. The accuracy of the registration measurement is thus increased.

Mask inspection microscopes can operate in transmission or in reflection. The image of the reticle arises either after transmission of the projection light through the mask or after reflection of the projection light at the surface of the mask. Both possibilities can also be combined.

The illumination is optimized in scanners for wafer exposure in accordance with the structures of the reticles that are to be imaged in each case. Use is made of different illumination settings that describe the intensity distribution of the illumination in a pupil plane of the illumination beam path of the mask inspection microscope. Conventional illumination settings having different degrees of coherence and off-axis illumination settings such as, for example, annular illumination and dipole or quadrupole illumination are customary. The depth of focus and/or the resolving power are increased by illumination settings for generating an off-axis, oblique illumination. In order to meet the ever more stringent requirements made of the imaging capacities of scanners, ever more sophisticated illumination settings are used in lithography. Thus, e.g. a combination of low-sigma annular and quasar, quasars that do not have 90° symmetry, etc. In the case of the method for increasing the resolution of the imaging of a scanner that is designated as a "computational scaling" solution, illumination settings are calculated in which the intensity distribution is finely gradated alongside minimum and maximum values.

In scanners, the degree of coherence of the illumination is set by means of zoom lenses. Annular illumination is achieved by means of rotationally symmetrical axicons; multipolar such as e.g. quadrupolar illumination can be achieved for example by means of pyramidal axicons or corresponding diffractive optical elements (DOEs). By means of displacing the axicons, the illumination setting can be varied within wide ranges. In the case of annular illumination, the inner coherence of the projection light is thus determined. In the case of zoom axicons, the outer coherence is defined at the same time. Any further illumination settings can be generated by means of special diffractive optical elements (DOEs) that are used by themselves or in conjunction with axicons and/or zoom lenses.

Optical units having a smaller image field than in the case of scanners are used in the case of mask inspection microscopes. Since the requirements made of the illumination intensity are lower in the case of mask inspection microscopes, the illumination settings are realized by means of simple diaphragms. One diaphragm is then required for each illumination setting. These diaphragms determine the intensity distribution of the illumination in a pupil plane of the mask inspection microscope by means of light-transmissive and light-opaque regions. The diaphragms are produced in chromium on glass, for example, in the case of illumination with projection light having a wavelength in the DUV range (the wavelength is, for example, 248 nm or 193 nm). They can also be produced from sheet metal or other suitable material having corresponding openings at light-transmissive locations. The magnitude of the intensity distribution generated by a diaphragm is varied by the combination with zoom lenses.

These diaphragms only enable illumination settings for which the intensity distribution in the pupil plane has a so-called "top hat" profile. In other words, the intensity distribution has exclusively regions with maximum and minimum intensity. The gradient between the dark and bright regions is very steep.

In the case of scanners, illumination settings with continuous intensity distributions are used. In other words, further gradations occur between maximum and minimum intensity. Transitions between regions of high and low intensities can have a shallower gradient. By way of example, in the case of the annular illumination that can be achieved by means of axicons, the gradient is smaller than in the case of the annular illumination generated by previous diaphragms. These smaller gradients have not been able to be realized hitherto by means of the abovementioned diaphragms known in mask inspection. The abovementioned illumination settings with finely gradated intensity values calculated by means of "computation scaling" have also not been able to be realized hitherto.

This means that numerous different illumination settings have to be made possible for adapting the illumination settings to the scanner for mask inspection microscopes. As soon as new illumination settings are found for the scanner, they also have to be made possible for mask inspection microscopes.

The object of the invention, therefore, is to provide a mask inspection microscope which makes it possible to adapt the illumination settings to those of the scanner even more accurately, in a simple and cost-effective manner.

According to the invention, this object is achieved by means of a mask inspection microscope comprising a diaphragm that is embodied in such a way that the resultant intensity distribution of the projection light has at least one further intensity value between a minimum and a maximum intensity value.

The illumination settings of the scanner can thus be simulated more accurately than has been possible hitherto, since a finer gradation between bright and dark regions of the resultant intensity distribution is made possible.

The resultant intensity distribution of the projection light of the pupil plane that is optically conjugate with respect to the object plane can be for example the intensity distribution of a real pupil plane that lies for example in a condenser of an illumination beam path. If the intensity distributions are realized only in the object plane, the intensity distribution of a virtual pupil plane should be understood here. The resultant intensity distribution of the projection light of the real or virtual pupil plane that is optically conjugate with respect to the object plane is also referred to hereinafter for short as "resultant intensity distribution".

The projection light used can be any form of electromagnetic radiation, thus for example laser radiation from excimer lasers in the DUV range having the wavelength of 365 nm, 248 nm, 193 nm, 153 nm or EUV radiation having the wavelength of 13.5 nm. The diaphragm should therefore be configured in such a way that it withstands radiation of the required intensity at the wavelengths used.

A detector for recording the aerial image can be arranged, for example, in a field plane of the mask inspection microscope, onto which field plane the reticle in the object plane is ultimately imaged. The data can thus be processed further by a data processing system that is furthermore provided.

The structure presented on a reticle is imaged. In the case of simple masks, said structure can be defined by the chromium layer situated on glass. The structure presented on the reticle is also imaged in the case of the different types of phase shaft masks such as, for example, alternating phase shift masks or attenuated phase shift masks.

In a further configuration of the invention, the diaphragm has at least one region which is composed of light-transmissive and light-opaque pixels, such that the at least one further intensity value is formed by said at least one region.

This measure has the advantage that such diaphragms are simple to produce. This is because no gradation of the transmission of the diaphragm is necessary here. It is only necessary to form maximally light-transmissive and light-opaque sections, which are referred to as pixels. This can take place proceeding from a light-transmissive substrate which is coated with a light-opaque layer at light-opaque locations. The light-transmissive substrate can also firstly be completely coated with a light-opaque layer. Light-transmissive pixels can then be formed by removing the light-opaque layer. By way of example, the plates can be formed from quartz glass, the surface of which is completely coated with chromium. The chromium is removed at light-transmissive locations. The methods for this are known from mask production in lithography. A further possibility is to use a spatial light modulator. The spatial light modulator is subdivided into individual regions which are embodied as pixels and which can be switched into a light-transmissive or light-opaque state or into a reflective or non-reflective state by means of a data processing system. Illumination settings can thus be changed in a rapid and simple manner. It is also possible to use diaphragms in reflection. These diaphragms then have light-reflecting and light-absorbing pixels instead of light-transmissive and light-opaque pixels. Such diaphragms can be used for example in the case of projection light in the EUV range.

In a further configuration of the invention, the at least one region is embodied as a light-transmissive region on which light-opaque pixels are arranged.

This measure is used, for example, if the total free area of a pixelated region is smaller than a specific proportion of the total area of the region. In the case of square pixels, this proportion is 50%.

This measure has the advantage that manufacturing tolerances during the production of a diaphragm are of lesser significance. The length of the edge of a pixel, that is to say the boundary between light-transmissive and light-opaque regions, is minimized since the manufacturing tolerances are of lesser significance, the smaller the ratio of edge length through pixel area.

In a further configuration of the invention, the at least one region is embodied as a light-opaque region on which light-transmissive pixels are arranged.

This measure is used for example when the total free area of a pixelated region is greater than a specific proportion of the total area of the region. In the case of square pixels, this proportion is 50%.

This measure has the same advantage as the measure mentioned above that manufacturing tolerances during the production of a diaphragm are of lesser significance.

In a further configuration of the invention, the distance between the pixels is embodied in such a way that only the zeroth diffraction order of the projection light diffracted at the diaphragm contributes to the at least one further intensity value.

This measure has the advantage that the pixels are not imaged in the resultant pupil plane. The homogeneity of the resultant intensity distribution is thus ensured.

The diffraction angles of higher diffraction orders of the projection light should be chosen to be so large, i.e. the distance between the pixels so small, that the higher diffraction orders of the projection light leave the illumination beam path. Higher diffraction orders of the projection light leave the illumination beam path if the diffraction angles are greater than twice the numerical aperture (NA) of the illumination beam path at the location of the diaphragm. Alternatively, they are screened off by a field stop arranged in the illumination beam path.

The NA at the location of the diaphragm can be estimated as follows. It is assumed that the etendue of the mask inspection microscope from the light source (if a homogenizer is used then downstream thereof) to the mask is constant. The following holds true:

Etendue=NA*beam diameter.

The beam diameter on the mask is designated by $d_m$, the beam diameter at the location of the diaphragm is designated by $d_B$, and the numerical aperture at the location of the mask is designated by $NA_M$. The following thus holds true for the numerical aperture $NA_B$ at the location of the diaphragm:

$NA_B=NA_M*d_m/d_B$

In order to remove all diffracted portions of the projection light from the beam path, the distances between the pixels have to be chosen such that the diffraction angles α are greater than or equal to twice the $NA_B$ at the location of the diaphragm. It follows that:

$$\sin \alpha = \lambda/p >= (2NA_B)$$

$$p <= \lambda/(2NA_B)$$

In a further configuration of the invention, the mask inspection microscope comprises a field stop that stops down projection light of higher diffraction orders that is diffracted at the diaphragm.

This measure has the advantage that smaller diffraction angles and hence larger distances between the pixels are made possible on the field stop without influencing the homogeneity of the resultant intensity distribution.

In a further configuration of the invention, the resolution of the pixels on the diaphragm is at least two pixels per smallest structural feature.

The smallest structural feature should be understood to mean the smallest dimension to be represented on the diaphragm, such as e.g. the pole of a dipole having the smallest diameter or, in the case of annular illumination, the smallest width of a ring. In the case of intensity gradients, the steepest transition from a highest to a lowest intensity can be characterized as the smallest structural feature.

The resolution of the pixels on the diaphragm is greater than the desired minimum resolution of the resultant intensity distribution by a factor of 2 to 20, for example.

In one configuration of the invention, the pixels are arranged in stochastic fashion since, consequently, no raster is imaged in the resultant pupil plane.

This measure is advantageous for example when the distance between the pixels is at least partly embodied in such a way that the zeroth and at least one further diffraction order of the diffracted projection light contribute to the at least one further intensity value. If the distance between the pixels exceeds the limit value mentioned above, the pixels are imaged in the resultant pupil plane as a result of interference of the at least two diffraction orders. In the case of such diaphragms it is advantageous to choose a resolution, that is to say the number of pixels per structural unit or pixels per area, with a sufficient magnitude.

In a further configuration of the invention, the at least one further intensity value is varied by the size of the pixels.

This measure is used for example in conjunction with the measure that only projection light of the zeroth diffraction order is used for the at least one further intensity value. Thus, the intensity value can be varied with a defined distance between the pixels, that is to say with fixedly predetermined diffraction angles.

In a further configuration of the invention, the at least one further intensity value is varied by the distance between the pixels.

This measure is used for example in conjunction with a stochastic arrangement of the pixels.

The variation of the size of and distance between the pixels on the diaphragm can be combined as desired.

In a further configuration of the invention, the pixels are arranged stochastically on the diaphragm.

If distances between the pixels are chosen which enable an imaging in the resultant pupil plane, a stochastic distribution prevents a raster from being imaged in the resultant intensity distribution.

In a further configuration of the invention, the pixels are embodied in square fashion.

This measure has the advantage that an areal, uninterrupted arrangement of the pixels is made possible.

The pixels can be arranged in a square raster, for example.

In a further configuration of the invention, the diaphragm has a transmission that varies in a location-dependent manner for the projection light, such that the at least one further intensity value is formed.

Since the transmission of the diaphragm can be finely gradated and the spatial resolution of the possible transmission changes over the area of the diaphragm is high, this measure has the advantage that a high resolution of the resultant intensity distribution is made possible. In particular, transitions between different intensity values can be formed in a continuous manner.

In a further configuration of the invention, the diaphragm has at least one absorber layer for varying the transmission.

In the case of this measure, the diaphragm is coated with a material of variable thickness, which at least partly absorbs or scatters the projection light.

In a further configuration of the invention, the diaphragm has at least one dielectric reflection layer for varying the transmission.

In one configuration, two dielectric reflection layers are arranged in at least one layer pair. Each of the layer pairs consists of a layer composed of a material having a high refractive index followed by a layer composed of a material having a low refractive index. The dielectric reflection layers can be applied on a carrier plate having a highest possible transmission for the projection light. This is quartz glass, for example, in the case of projection light having the wavelength $\lambda=193$ nm.

The transmission is then altered in one variant by means of the number of layer pairs. The higher the number of layer pairs, the lower the transmission becomes. The thickness of the layers is in this case, for example, a quarter of the wavelength of the projection light.

In a further variant, the thickness of the layers of a layer pair is varied in order to alter the transmission. The greater the extent to which the layer thickness is deviated from the quarter of the wavelength of the projection light, the greater the transmission becomes. The number of layer pairs and layer thickness can also be varied jointly.

The thickness of the dielectric reflection layer is adapted to the wavelength of the projection light. The greater the number of layers, the more light is reflected at them and the lower the transmission. In one configuration of the invention, the layers are arranged in pairs. The layer pairs can be formed from in each case one low refractive index dielectric layer and one high refractive index dielectric layer.

This measure has the advantage that no energy of the projection light is absorbed in the diaphragm. Since said energy can lead to the heating or destruction of the diaphragm, with these diaphragms it is possible more simply to provide diaphragms which withstand a high intensity of the projection light.

In a further configuration of the invention, at least two diaphragms used as first diaphragm or as further diaphragm are arranged on a diaphragm plate, such that the individual diaphragms are changed by the movement of the diaphragm plate.

The diaphragm plate can be arranged at the desired position in the illumination beam path by means of a mount in such a way that a desired diaphragm can be introduced into the illumination beam path by means of displacing the diaphragm plate. This displacement can be effected by means of a drive, such as, for example, a piezo-element or an electric motor. Different diaphragm plates can also be provided, such that a multiplicity of further diaphragms are available simply by exchanging the diaphragm plate.

The mount of the diaphragm plate is configured in such a way that exchange is possible in a simple manner, but the position of the diaphragm plate relative to the mount is defined with high accuracy. The reproducibility of the positioning in the illumination beam path has to be very high in the case of repeated installation and demounting.

The diaphragm plate can also have the form of a mask which is introduced into the illumination beam path by means of a special mount. This has the advantage that such diaphragms can be produced by means of conventional methods for mask production.

With the use of a plurality of diaphragm plates that are arranged simultaneously in one and/or a plurality of illumination beam paths, by combining the respective diaphragms of the different diaphragm plates the number of combination possibilities is even higher.

This measure has the advantage that a multiplicity of different diaphragms which can be exchanged in a rapid and simple manner are available in a simple manner.

In a further configuration of the invention, a data record having information about positions of the diaphragms on the diaphragm plate is present with respect to each diaphragm plate.

This measure permits the automatic positioning of a diaphragm of a diaphragm plate and the selection of a diaphragm having specific properties e.g. according to the choice of the user or by means of an algorithm of a data processing system.

The position of a diaphragm is specified for example as coordinates of the midpoint of the diaphragm proceeding from a reference point on the diaphragm plate.

In a further configuration of the invention, a data record having information about properties of the diaphragms is present with respect to each diaphragm plate.

By way of example, the outer and inner degrees of coherence or the aperture angles or positions and diameters of poles are specified as properties of the diaphragms. It is also possible to specify the complete form or a graphical representation of the diaphragms.

In a further configuration of the invention, a machine-readable marking, for example a barcode or an inscription that is machine-readable by character recognition (optical character recognition, OCR), is fitted on the diaphragm plate. This marking can be read for example by means of the imaging of the corresponding region of the diaphragm onto the detector for recording the aerial image, if a Bertrand lens has been introduced into the beam path of the mask inspection microscope, or by means of a barcode reader.

By means of this marking, the diaphragm can be assigned to the associated data record in a simple manner.

In a further configuration of the invention, a data processing system is provided, which determines possible illumination settings with respect to predetermined diaphragm plates.

By combining the diaphragms present, numerous illumination settings are possible. For the user it is now difficult, given this multiplicity of combination possibilities, to select the appropriate one in each case. If data concerning the properties of the diaphragms and concerning the illumination settings to be achieved by means of corresponding combination possibilities are stored in the data processing system, all the combination possibilities can be determined. The user can then select the desired illumination setting from the possibilities determined.

The data processing system can also take account of the different combination possibilities of the diaphragms in conjunction with the sequential or parallel arrangement of the diaphragms or the possibility of the magnification or demagnification of intensity distributions of individual pupil planes with the aid of a zoom lens.

In a further configuration of the invention, at least one polarizer is arranged in the at least one illumination beam path.

Polarizer should be understood here to mean any type of polarization-influencing optical elements.

This measure has the advantage that the projection light, during mask inspection, can be adapted even more precisely to the conditions of the scanner. Polarized illumination is advantageous in the case of high-aperture scanners, in particular. By way of example, linearly, radially or tangentially polarized light can be used here.

In a further configuration of the invention, at least one of the polarizers linearly polarizes the projection light.

Linear polarization can be achieved in a simple manner in respect of apparatus, for example by means of polarizing beam splitters. In the case of illumination settings e.g. in the form of dipoles or disars, linear polarization comes close to the desired tangential illumination.

In a further configuration of the invention, at least one of the polarizers polarizes the projection light at least in sections tangentially with respect to the optical axis of the illumination beam path.

As already mentioned, during mask inspection one frequent task is to simulate the tangential polarization of the projection light of the scanners. In the case of annular illumination setting or quasars having large aperture angles or in the case of quadrupoles or quasars, the use of linearly polarized light is not sufficient. Tangentially polarized projection light can be provided here. This can be effected for example by rotation in sections of the direction of linearly polarized light by means of a further polarizer, which is also referred to as a polarization converter. By way of example, a subdivision into 4, 8 or 12 sections can be effected in this case. It is also possible, as usual in the case of scanners, to provide a continuous tangential polarization.

In a further configuration of the invention, the resultant intensity distribution of the projection light of the pupil plane that is optically conjugate with respect to the object plane is influenced by a plurality of diaphragms.

The arrangement of the diaphragms is variable. It is possible, for example sequentially along the at least one illumination beam path. The diaphragms can be arranged directly one behind another or at a distance from one another, for example, within an illumination beam path.

In the case of a plurality of illumination beam paths, it is also possible to arrange different diaphragms in the different illumination beam paths, which are arranged parallel for example. The intensity distribution relevant to the illumination is then the pupil plane that is optically conjugate with respect to the object plane and results from superposition of the intensity distributions of the parallel pupil planes.

The sequential arrangement of diaphragms along an illumination beam path and that in parallel observation beam paths can be combined as desired.

The generation of the intensity distribution of the pupil plane that is optically conjugate with respect to the object plane by means of a plurality of different diaphragms makes it possible, on the one hand, to achieve illumination settings that would not be possible within the one diaphragm, for example as a result of the superposition of pupil planes with different intensity distributions of the projection light. On the other hand, the provision of a set of individual diaphragms with simultaneous use of a plurality of diaphragms leads to a multiplicity of combination possibilities, as a result of which the number of possible different illumination settings becomes greater than the number of diaphragms present.

In a further configuration of the invention, at least two diaphragms are arranged along an illumination beam path.

In the case of this sequential arrangement of the diaphragms, the projection light impinges successively on at least partly different diaphragms. Each diaphragm can thus contribute to reducing the intensity distribution at least partly different locations of the pupil plane that is optically conjugate with respect to the object plane.

This measure has the advantage that a multiplicity of illumination settings can be made possible in a simple manner even in the case of simple configuration of a mask inspection microscope with only one illumination beam path.

In a further configuration of the invention, at least two diaphragms are arranged in different pupil planes.

In the case of this configuration, the intensity distribution of one pupil plane is imaged onto at least one other pupil plane. If a diaphragm is again situated in the latter, the intensity distribution is influenced further by said diaphragm. The number of illumination settings can be increased further in particular by altering the magnitude of the intensity distribution during the imaging, by means of a zoom optical unit.

This measure has the advantage that all the diaphragms can be situated exactly in a pupil plane and can thus be imaged sharply onto one another.

In a further configuration of the invention, at least two diaphragms are arranged jointly in one of the pupil planes.

The diaphragms arranged jointly in a pupil plane act to a good approximation like a common diaphragm.

If a sharp imaging is desired, the two diaphragms can be arranged along the observation beam path so close together that both lie in the region of the depth of focus of the respective pupil plane. A typical distance is 2 mm, possibly even less than that.

This measure has the advantage that the illumination beam path can be made short and thus configured in a space-saving manner.

In a further configuration of the invention, at least one first set of the diaphragms is configured in such a way that the radius-dependent intensity distribution of the projection light and at least one second set of the diaphragms is configured in such a way that the angle-dependent intensity distribution of the projection light is determined.

The radius-dependent diaphragms typically define the outer and the inner coherence of the illumination light, those parameters that define the annular illumination often encountered in lithography. By means of the angle-dependent diaphragms, for example, the number and the extent of the poles in the case of multipolar illumination, such as e.g. disars or quasars. A limiting case is the conventional illumination with an inner coherence of zero, that is to say a disc-shaped, i.e. circular, intensity distribution.

This measure has the advantage that adaptation to illumination settings that are typical in lithography is simplified.

A further configuration of the invention is, in particular, a combination with the diaphragm plates in accordance with a configuration of the invention described above, wherein each of the sets of diaphragms is arranged on a diaphragm plate. The desired combinations of the diaphragms are thus rapidly accessible.

In a further configuration of the invention, the at least one illumination beam path, for splitting the projection light, is split at least in sections into at least two illumination beam paths and at least one diaphragm is arranged in each of the illumination beam paths.

The projection light can be split by means of simple beam splitters. Polarization-independent beam splitters can also be used. A compromise between apparatus outlay and resulting advantages is to provide two illumination beam paths.

The diaphragms are arranged parallel here in such a way that each of the at least one diaphragm arranged in each of the illumination beam paths, at different locations of the pupil plane that is optically conjugate with respect to the object plane, can contribute to increasing the intensity distribution. In the case of diaphragms having regions having identical transmission, the magnitude of the intensity can be varied by the superposition of intensities.

Thus, with individual diaphragms, with a tenable outlay during production, it is possible to realize only so-called "top hat" profiles with an almost abrupt change in the intensity distribution. Softer transitions in the resultant intensity distribution of the pupil plane can be achieved by the superposition of two or more intensity distributions having slightly different magnitudes.

In a further configuration of the invention, the illumination beam paths are recombined upstream of the object plane.

This combining can also be effected by means of a polarization-independent beam splitter. This can also be combined with the configuration that a specific polarization of the projection light was achieved within the illumination beam paths.

Polarizing beam splitters, for example beam splitters that are linearly polarizing in the X, Y direction, can be used both for splitting the polarization light and for combining. The polarization obtained in the individual illumination beam paths can then be utilized in a targeted manner for illumination settings. When the illumination beam paths are combined, the respective projection light of individual illumination beam paths can be fully utilized by means of polarizing beam splitters used in a targeted manner.

Polarizers can be arranged in one or in each of the illumination beam paths or downstream of a combining of the illumination beam paths.

This measure has the advantage that the intensity distribution of the projection light in the pupil plane can be varied in a targeted manner by the superposition of individual intensity distributions of the pupil planes of the further illumination beam paths.

In a further configuration of the invention, polarization converters for the elimination of undesired polarization of the projection light are arranged in at least one of the illumination beam paths.

The splitting and combining of the projection light by beam splitters can also result in the occurrence of undesired polarizations of the projection light. By means of the arrangement of polarization converters, the undesired polarizations can be rotated with respect to one another in such a way that they are eliminated. In one configuration of the invention, $\lambda/2$ plates are used here.

In a further configuration of the invention, at least two of the diaphragms influence the intensity distribution of the pupil plane at different locations.

This measure affords a further possibility of obtaining further illumination settings by combination of diaphragms. Thus, by way of example, the combination of two dipoles rotated by 90° in the pupil plane can result in a quadrupolar intensity distribution.

In a further configuration of the invention, at least one polarizer is arranged in each of the illumination beam paths.

This measure affords a possibility of combining or superposing polarized projection light. Thus, the above-described configurations of the polarizers can be arranged in each of the illumination beam paths. Thus, there is the possibility of providing projection light having different polarization directions in different regions of the pupil plane. If there were for example two dipoles rotated by 90° in each of the observation beam paths, given corresponding arrangement of polarizers for generating linearly polarized light in each of the observation beam paths, a quadrupolar intensity distribution having to a good approximation tangential polarization can be achieved as a result.

In a further configuration of the invention, the projection light is split between the illumination beam paths to the extent of identical portions in each case.

This splitting can be effected by simple beam splitters. Given two illumination beam paths, the light is distributed uniformly between both illumination beam paths.

In a further configuration of the invention, an attenuator is arranged in at least one of the illumination beam paths.

This makes it possible to vary the intensity distribution further. Thus, the proportion made up by the intensity distributions of the individual illumination beam paths in the resultant intensity distribution of the projection light of the pupil plane that is optically conjugate with respect to the object plane can be weighted differently. In the case of two illumination beam paths, an attenuator can be arranged in each of them.

Plates whose transmissivity for the respective projection light increases along the direction of movement are used as attenuators. Thus, the radiation is attenuated to a greater extent, the greater the extent to which the attenuator is introduced into the illumination beam path.

In a further configuration of the invention, a shutter is arranged in at least one of the illumination beam paths.

This arrangement makes it possible to eliminate the contribution from illumination beam paths that is not required for specific illumination settings by closing the respective shutters.

Generally, diaphragms introduced into the illumination beam path have to be centred, that is to say oriented with respect to the optical axis. In this case, e.g. the intensity distribution of the pupil plane that is generated by the diaphragm is imaged by a Bertrand lens on the detector of the mask inspection microscope. The diaphragm is then adjusted until this image has the desired position. It is possible in a simple manner here to centre each of the diaphragms individually. If there is a shutter in each of the illumination beam paths, the illumination beam path containing the respective diaphragm to be centred can be opened and the shutters of the remaining illumination beam paths can be closed.

In a further configuration of the invention, at least one zoom lens is arranged in the at least one illumination beam path, a pupil plane of the at least one illumination beam path being imaged in variable size onto at least one further pupil plane of the illumination beam path by means of said at least one zoom lens.

This measure enables the illumination settings to be varied even more finely. Thus, the intensity distribution generated by one diaphragm in one pupil plane with variable magnitude can be combined with the intensity distribution generated by another diaphragm in another pupil plane.

This is advantageous both in the case of the sequential and in the case of the parallel arrangement of diaphragms.

In the case of the sequential arrangement of diaphragms, the values for the outer and inner coherence can be varied e.g. by means of an annular diaphragm.

Given for example two identical diaphragms arranged sequentially, soft gradients of the profile of the resultant intensity distribution can be realized by superposition of two images of the pupil that differ slightly in size.

This patent specification additionally relates to a diaphragm for use in a pupil plane of a mask inspection microscope comprising: a light source that emits projection light and at least one illumination beam path for generating an image of the structure of a reticle arranged in an object plane in a field plane of the mask inspection microscope, wherein the diaphragm is embodied in such a way that a resultant intensity distribution of the projection light can be generated in a pupil plane (135) of the illumination beam path (3, 87, 88) that is optically conjugate with respect to the object plane, wherein the diaphragm is embodied in such a way that the resultant intensity distribution of the projection light has at least one further intensity value between a minimum and a maximum intensity value.

In a further configuration of the invention, the diaphragm has at least one region which is composed of light-transmissive and light-opaque pixels, such that the at least one further intensity value is formed by said at least one region.

In a further configuration of the invention, the at least one region is embodied as a light-transmissive region on which light-opaque pixels are arranged.

In a further configuration of the invention, the at least one region is embodied as a light-opaque region on which light-transmissive pixels are arranged.

In a further configuration of the invention, the distance between the pixels is embodied in such a way that only the zeroth diffraction order of the projection light diffracted at the diaphragm contributes to the at least one further intensity value.

In a further configuration of the invention, the resolution of the pixels on the diaphragm is at least two pixels per smallest structural feature.

In a further configuration of the invention, the at least one further intensity value is varied by the size of the pixels.

In a further configuration of the invention, the at least one further intensity value is varied by the distance between the pixels.

In a further configuration of the invention, the pixels are arranged stochastically on the diaphragm.

In a further configuration of the invention, the pixels are embodied in square fashion.

In a further configuration of the invention, the diaphragm has a transmission that varies in a location-dependent manner for the projection light, such that the at least one further intensity value is formed.

In a further configuration of the invention, the diaphragm has at least one absorber layer for varying the transmission.

In a further configuration of the invention, the diaphragm has at least one dielectric reflection layer for varying the transmission.

This patent specification additionally relates to a method for producing a diaphragm for use in a mask inspection microscope comprising the following steps: —predetermining the intensity values of the resultant intensity distribution of the projection light which are to be realized by the diaphragm to be produced; —converting the intensity values into positions, forms and sizes of the light-transmissive and light-opaque pixels that are to be arranged on the diaphragm; —producing the diaphragm.

In order to convert the resultant intensity distribution, in one configuration of the invention, firstly the form and the arrangement of, and the distance between, the pixels is selected. A determination is then made as to which of these parameters are varied in which ranges. The arrangement of the pixels can be stochastic, for example, can be in a raster, the raster can be square or hexagonal.

In a further configuration of the method for producing a diaphragm for use in a mask inspection microscope, the relationship between the intensity values and positions and sizes of the pixels is determined by calibration.

The relationship between pixel size, distance and intensity is determined by calibration for each system. For this purpose, a calibration diaphragm is produced. The latter has different regions. Pixels of a defined combination of the parameters distance between and size of the pixels in the predetermined arrangement are formed in each region. The parameters are varied over a widest possible range. The resultant intensity values of the individual regions are determined by means of the mask inspection microscope.

This measure has the advantage that after the desired properties of a diaphragm have been predetermined, the targeted production is made possible in a simple and rapid manner.

In a further configuration of the method for producing a diaphragm for use in a mask inspection microscope, the following steps are carried out: —measuring the intensity distribution of the projection light in the pupil plane without a diaphragm; —calculating required corrections of the predetermined intensity values in order to compensate for inhomogeneities of the measured intensity distribution; —correcting the predetermined intensity values.

This measure makes it possible to compensate for any inhomogeneities of the illumination of the pupil plane that may be present, without further diaphragms or pupil filters being required. The corrected intensity values are converted into positions and sizes of the light-transmissive and light-opaque pixels that are to be arranged on the diaphragm, and the diaphragm is then produced.

The inhomogeneities of the illumination of the pupil plane can also be taken into account during the production of the other abovementioned diaphragms having variable transmission.

It goes without saying that the features of the invention mentioned above and those yet to be explained below can be used not only in the described combinations but also in further combinations or individually, without departing from the scope of the present invention.

The invention is described and explained in greater detail below on the basis of some selected exemplary embodiments and with reference to the drawings, in which.

Figure 1:
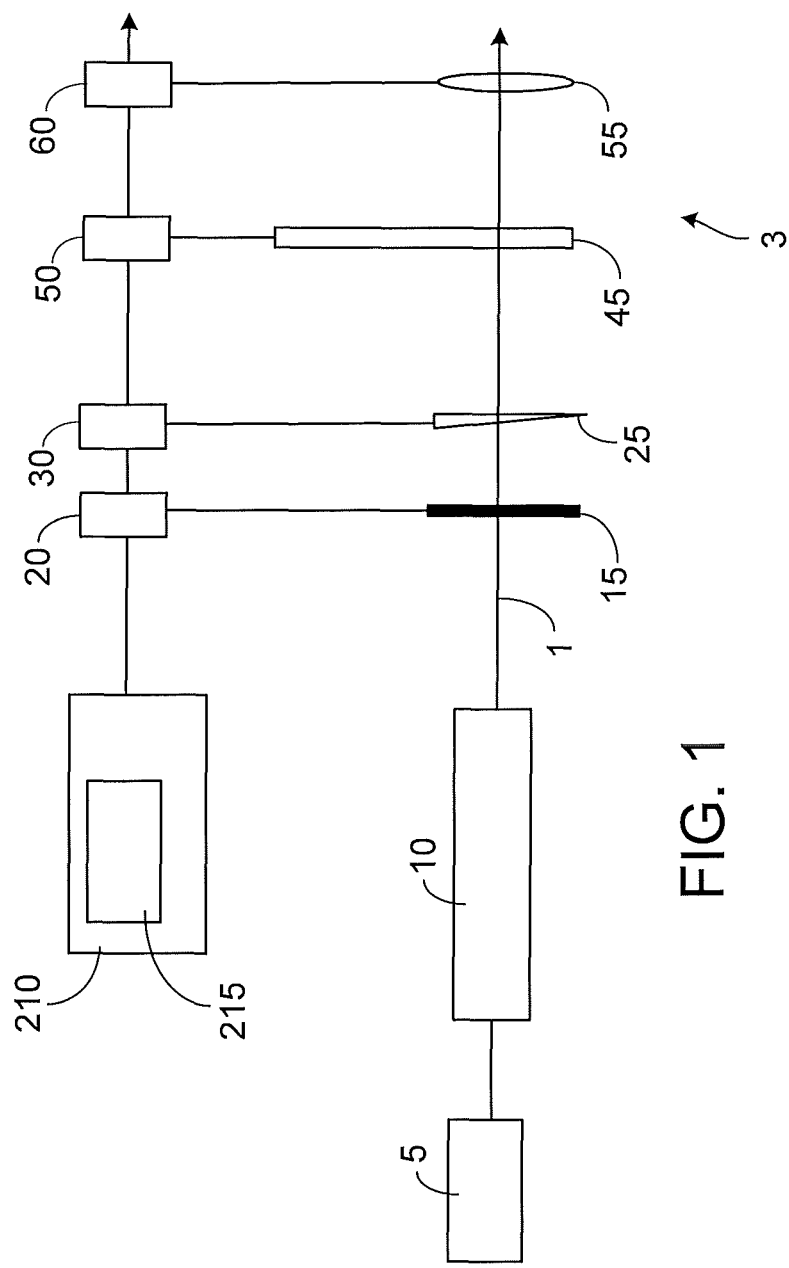
FIG. 1 shows a longitudinal section through a section of an illumination beam path of a mask inspection microscope according to the invention.

A mask inspection microscope according to a first exemplary embodiment comprises, as illustrated in FIG. 1, a light source 5, an excimer laser, which emits projection light having the wavelength of 193 nm. There follows along the optical axis 1a homogenizer for homogenizing the intensity distribution of the projection light in the pupil plane and for depolarizing said light. There then follows a shutter 15, which can be introduced into or moved out of the illumination beam path 3 by means of the drive 20. It is composed of a radiation-opaque steel sheet. There then follows along the optical axis 1 an attenuator 25 for varying the illumination intensity. Said attenuator can be moved into the illumination beam path 3 in a continuously variable manner by means of drive 30. The attenuator 25 comprises a plate composed of quartz glass that is coated with chromium. The thickness of the chromium layer increases along the direction of movement. Thus, the radiation is attenuated to a greater extent, the greater the extent to which the attenuator 25 is introduced in the illumination beam path 3. The attenuator 25 can also be provided with a dielectric layer, with the same effect.

There then follows the diaphragm plate 45, which is arranged in a pupil plane of the illumination beam path 3. The control is effected by means of drive 50, which enables the diaphragms 51 to be positioned accurately.

Figure 3:
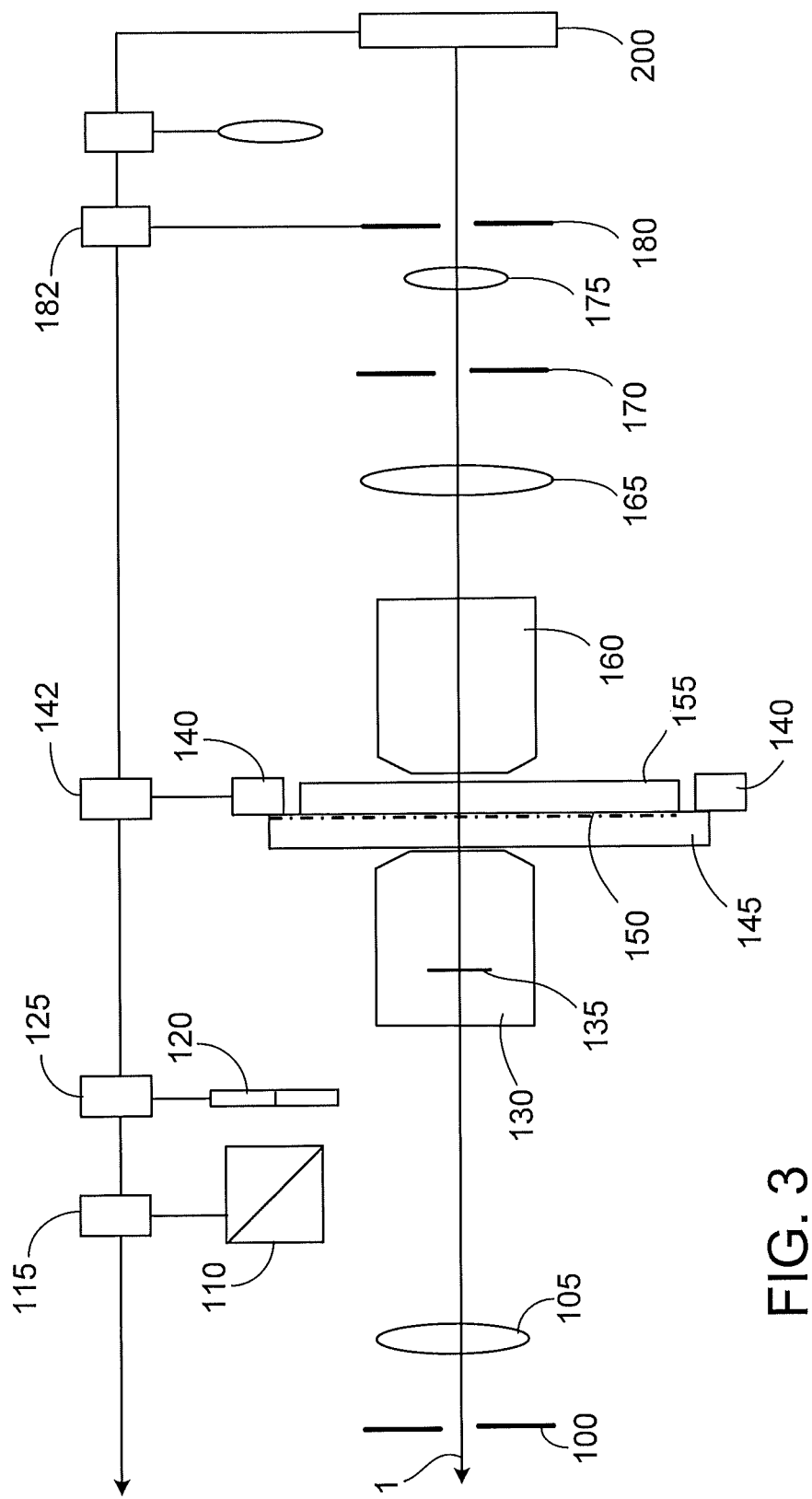
FIG. 3 shows a longitudinal section through a section of an illumination beam path and imaging beam path of a mask inspection microscope according to the invention.
Figure 4:
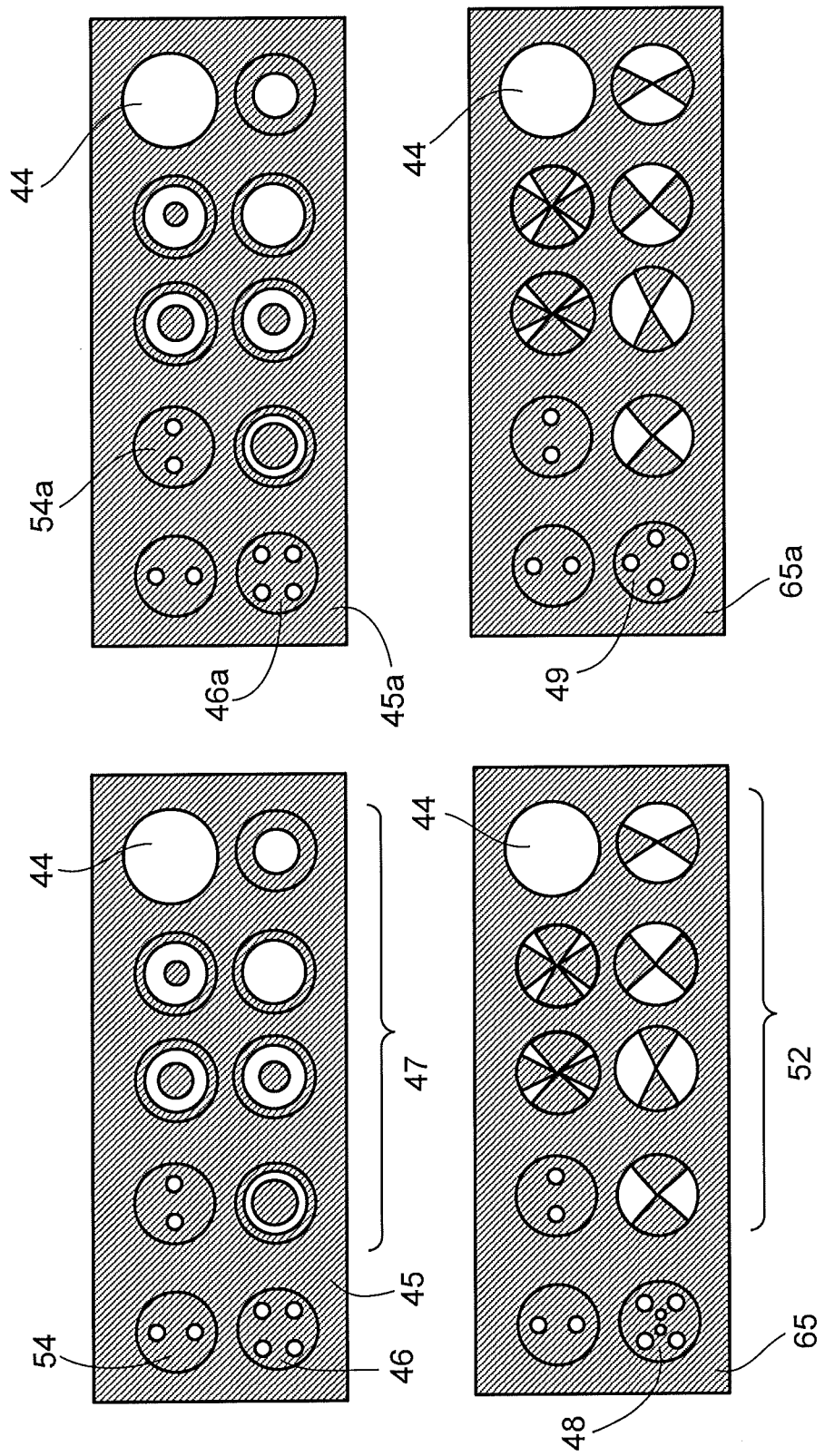
FIG. 4 shows a plan view of different diaphragm plates.

The set diaphragm of the diaphragms 51 is imaged onto the resultant pupil plane 135 of the condenser 130, as illustrated in FIG. 3, in the desired size by means of a zoom lens 55 with actuating drive 70. The imaging scale can be varied by a factor of 3. The diaphragm plates are illustrated in FIG. 4; the projection-light-opaque regions are illustrated in hatched fashion. The diaphragm plate 45 is exchangeably connected to the drive 50, by means of quick-acting clamping device 240. The quick-acting clamping device 240 is part of the drive 50.

Figure 5:
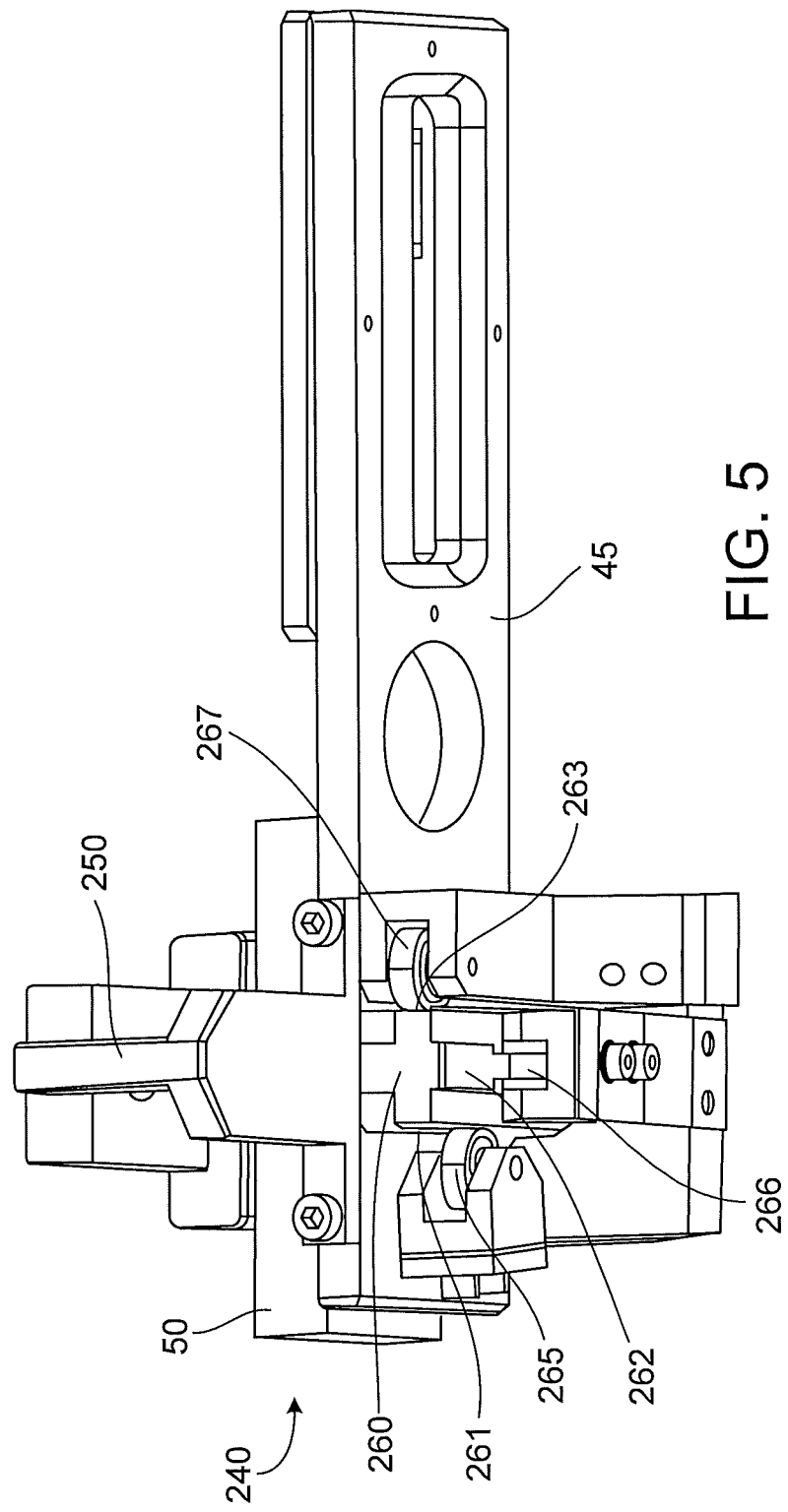
FIG. 5 shows a quick-acting clamping device for fixing a diaphragm plate.

Quick-acting clamping device 240 is described in detail in FIG. 5. Diaphragm plate 45 is held by the user at a handle 250. The individual diaphragms are not illustrated here. The fixing web 260 is part of the diaphragm plate 45. Against the surfaces 261, 262 and 263 of said web, the rollers 265, 266 and 267, to which spring force is applied, press the diaphragm plate against the holder 270, which is connected to the motors (not described in greater detail). If the diaphragm plate has been completely fixed, the roller 266 latches into a depression (not illustrated) on the surface 262.

The continuation of the illumination beam path 3 of the first exemplary embodiment is illustrated in FIG. 3. There follows a field stop 100 for determining the size of the illumination field on the reticle 145. Downstream of the field stop 100 there follow a tube lens 105 and the condenser 130 with the pupil plane 135. The square opening of the field stop 100 has an edge length of 340 µm. This produces an image field having an edge length of 26 µm on the mask. In a further exemplary embodiment (not illustrated in the figures), no field stop 100 is present.

For polarizing the projection light, the polarizers 110 and 120 can be introduced into the illumination beam path 3 by the drives 115 and 125. Polarizer 110 linearly polarizes the projection light; the direction of the polarization can be set by rotation of the polarizer 110 by drive 115. In order to achieve tangential polarization of the illumination light, in addition to the polarizer 110 the polarizer 120, which is embodied as a segmented polarization converter, is introduced into the illumination beam path 3. The linear polarization is rotated sector by sector by said polarizer 120, such that approximately tangential polarization results. Three variants of the polarizer 120 are available (not illustrated in FIG. 3). It is possible to choose between the subdivisions into 4, 8 or 12 sectors.

The mask 145 having the structure 150 that is to be inspected is protected by a pellicle 155. The mask lies on the mask holder 140, which is moved laterally by drive 142 in order to move the mask to the desired position, such that the location to be inspected is situated in the illumination beam path 3. The image of the reticle is imaged by objective 160 via the tube lens 165, field stop 170, magnification optical unit 175 onto the detector 200, a CCD chip (charge coupled device). The numerical aperture is set by the NA stop 180 with drive 182.

For imaging the pupil plane of the illumination beam path 3 on the detector 200, a Bertrand lens 185 is introduced into the illumination beam path 3 by drive 190.

All the drives 20, 30, 50, 60, 70, 80, 115, 125, 142, 182, 190, 185 and the detector 200 are connected to a data processing system 210 with input and output unit 215. The mask inspection microscope is controlled by said data processing system 210, and in addition the respective image is stored by the read-out of the detector 200, and the image data are processed further.

If a diaphragm of the diaphragm plates 45 or 65 is introduced into the illumination beam path by means of drive 50 or 70, it has to be centred with respect to the optical axis 1 of the illumination beam path 3. For this purpose, the image of the diaphragm is imaged via the Bertrand lens 185 on the detector 200. The relevant diaphragm plate is then moved laterally until the image of the diaphragm has attained the desired position. Detector 200 is calibrated beforehand, that is to say that the position of the point of intersection of the optical axis with the surface of the detector is known.

A mask inspection microscope that operates in transmission was described in the first exemplary embodiment. In a further exemplary embodiment, which is not illustrated in the drawings, the mask inspection microscope operates in reflection. Here, the reticle 145 is illuminated from the side of the structure 150. The reticle therefore lies precisely with the opposite side on the mask holder 140. The light reflected at the structure 150 is coupled out from the illumination beam path 3 by a beam splitter in a known manner and proceeds further, as illustrated in FIG. 3, as far as the imaging on a detector 200.

Figure 3A:
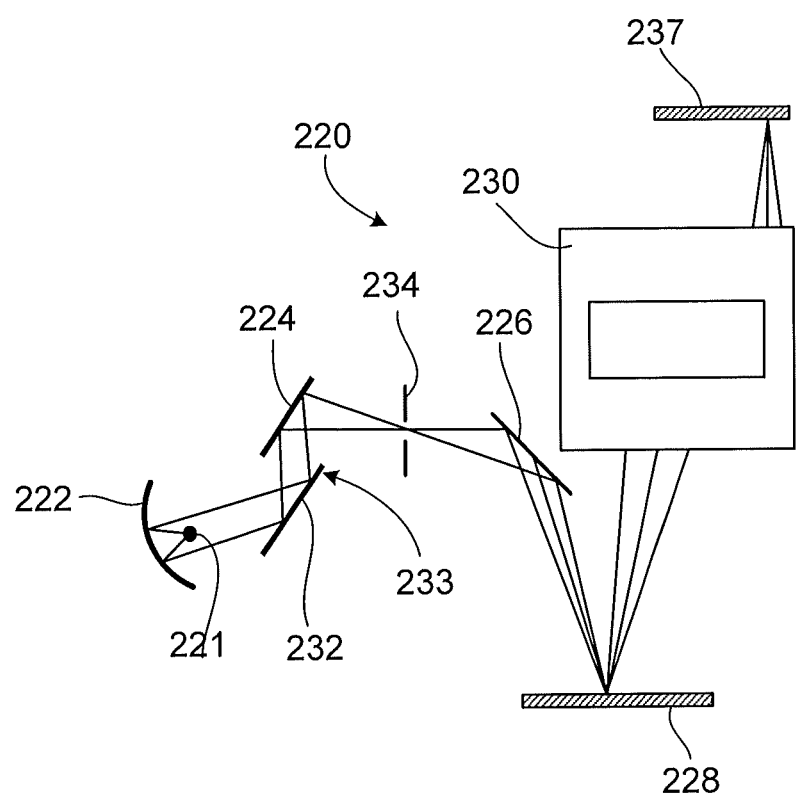
FIG. 3a shows a schematic illustration of a mask inspection microscope according to the invention which operates with projection light in the EUV range.

In a further exemplary embodiment, the mask inspection microscope is operated with projection light in the EUV range having the wavelength of 13.5 nm. The construction is shown in FIG. 3a. The light from an EUV light source 221 is collected by a collector 222 and reflected via mirrors 224 and 226 onto an EUV mask 228 to be examined. A field stop 234 serves for determining the size of the illumination field on the EUV mask 228. With diaphragm 232, which are arranged on a diaphragm plate 233, the desired illumination settings are realized (analogously to, for example, the diaphragms on the diaphragm plates 45, 65). An image of the EUV mask is imaged, by means of the imaging system 230, onto a detector 237 connected to a data processing system (not illustrated), which reads the detector and processes the image data further.

In the first exemplary embodiment, the diaphragms 51 of the diaphragm plate 45 are produced by chromium on quartz glass. Light-transmissive regions are free of chromium, and light-opaque regions are provided with a chromium layer. The chromium layer is formed with a thickness such that it is totally light-opaque. For continuous variation of the intensity distribution in the resultant pupil plane, light-transmissive, that is to say chromium-free regions are formed on chromium-coated regions of the diaphragm, or chromium-coated regions are formed on chromium-free regions. These regions are referred to as pixels.

A further exemplary embodiment involves the embodiment of the diaphragm plate 45 with diaphragm 51 as a spatial light modulator. The latter is based on a liquid crystal display. The latter is divided in the region acting as diaphragm 51, into pixels which can assume a light-transmissive or light-opaque state or reflective or non-reflective state. The square pixels are arranged in a matrix of 600*600 pixels. By means of the data processing system 210, the pixels can be switched into the desired state in order to perform a specific illumination setting.

For the mask inspection system 221 for examining EUV masks, see FIG. 3a, use is made of reflective diaphragms 232 that are constructed analogously to EUV masks. The reflective regions are constructed from molybdenum-silicon layers on Zerodur or ULE. Regions that are not intended to reflect EUV radiation are either coated with absorbers (e.g.: composed of tantalum nitride, chromium nitride, silicon oxide) (absorber mask) or the molybdenum-silicon layers have been at least partly removed there (etched multilayer mask).

In one exemplary embodiment, the distance between the pixels is chosen to be so small that exclusively projection light of the zeroth diffraction order, i.e. undiffracted light, is imaged into the resultant pupil plane. Consequently, the pixels are not resolved in the resultant pupil plane. Higher diffraction orders are screened off by the field stop, or the diffraction angles are greater than twice the numerical aperture (NA) of the illumination beam path at the location of the diaphragm.

As mentioned above, the following holds true for a mask inspection microscope in accordance with the first exemplary embodiment:

Etendue=NA*beam diameter.

The illumination beam path has, on the mask side, an $NA_M$=0.35, and the beam diameter on the mask is $d_m$=150 µm. The beam diameter at the location of the diaphragm is $d_B$=2900 µm.

The following holds true for the $NA_B$ at the location of the diaphragm:

$NA_B=NA_M*d_m/d_B=0.018$

If the diffraction angles α are greater than or equal to twice the $NA_B$ at the location of the diaphragm, the following holds true:

$\sin \alpha=\lambda/p>=2NA_B$ $p<=\lambda/(2NA_B)$

In the case of projection light at =193 nm, it follows that: p<=5.5 µm.

In the case of a square field stop 100 having an edge length of 26 µm (of the image field on the mask), a maximum distance between the pixels results as p=31 µm.

Figure 6:
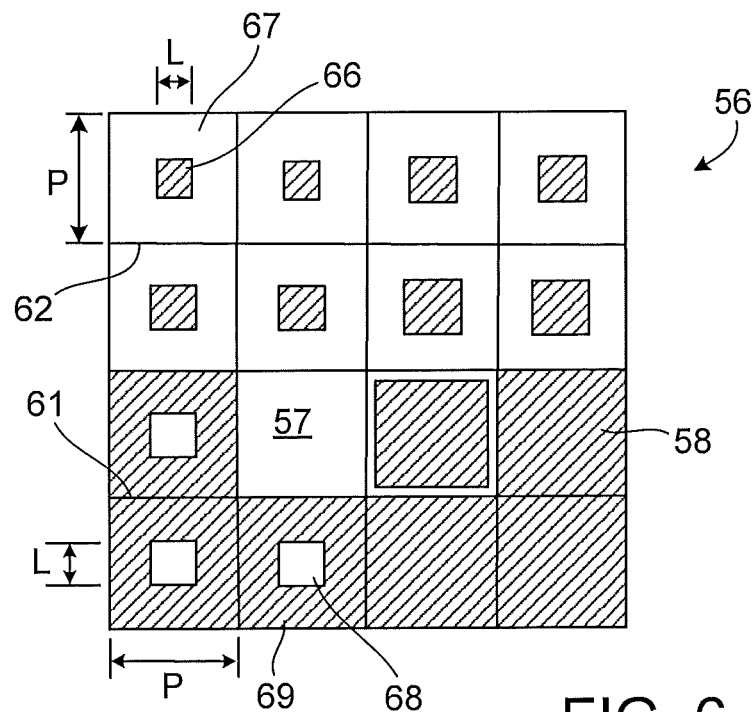
FIG. 6 shows pixels of a diaphragm in detail.

In one exemplary embodiment, the pixels have a constant distance of p=4.8 µm with variable size. The pixels embodied in a square fashion are arranged in a square raster. An excerpt 56 from such a pixelated diaphragm is represented in FIG. 6. The distance between the pixels, or the raster of the pixels, is designated by p and the edge length of the pixels is designated by L. In order to illustrate the raster, lines, e.g. 61 and 62, are depicted, these lines not being present on the real diaphragm. Regions 57 having an intensity in the resultant pupil plane of 100% are completely free of chromium, such as the region designated by the reference sign 57. Regions 58 having an intensity of 0 are completely coated with chromium. Regions having intensities gradated further are either embodied as pixels 66 in chromium (illustrated in hatched fashion) on a free area 67 or the pixel is embodied as a chromium-free area 68 in a chromium area 69. The square pixels are in each case arranged in the centre of the respective raster.

The chromium pixels on a free area are used for regions having a chromium covering of less than 50% of the total area of the region. Chromium-free pixels on a chromium area are used for regions having a chromium covering of greater than 50%. For chromium-free pixels, for simpler notation it is defined that L assumes negative values, where the absolute value corresponds to the edge length of the pixel.

In a further exemplary embodiment, during the production of the mask with a mask writer having increased accuracy, either exclusively chromium pixels on a free area or chromium-free pixels on a chromium area are used.

A calibration diaphragm has regions having a plurality of square pixels having the same edge length L. For different L values of 0 to 4.8 μm, different regions, for example 20 regions, are formed. For the purpose of normalization, regions which are completely covered with chromium and regions which are completely free of chromium are also formed on the calibration diaphragm.

In order to carry out the calibration, the calibration diaphragm is inserted into the mask inspection microscope, and the Bertrand lens 185 is introduced into the beam path. The intensities for the different regions of the calibration diaphragm are then recorded by means of the detector 200. The relationship between the resultant intensity and the respective regions is thus determined. For the purpose of normalization, diaphragm regions free of chromium are assigned an intensity of 100%, and diaphragm regions completely covered with chromium are assigned an intensity of 0%.

For diaphragms having square pixels by which exclusively projection light of the zeroth diffraction order is imaged into the resultant pupil plane, the surprising relationship has been discovered that the resultant intensity ($I_{res}$) is to a good approximation proportional to the square of the ratio of free area ($F_{fr}$) and total area ($F_g$).

$$I_{res} \sim (F_{fr}/F_g)^2$$

For the diaphragms having a square raster having the length p and square pixels having the edge length L in this exemplary embodiment, it follows for chromium pixels on a free area that:

$$I_{res} \sim (1-(L/p)^2)^2$$

The following holds true for chromium-free pixels on a chromium-covered area:

$$I_{res} \sim (L/p)^4$$

Figure 7:
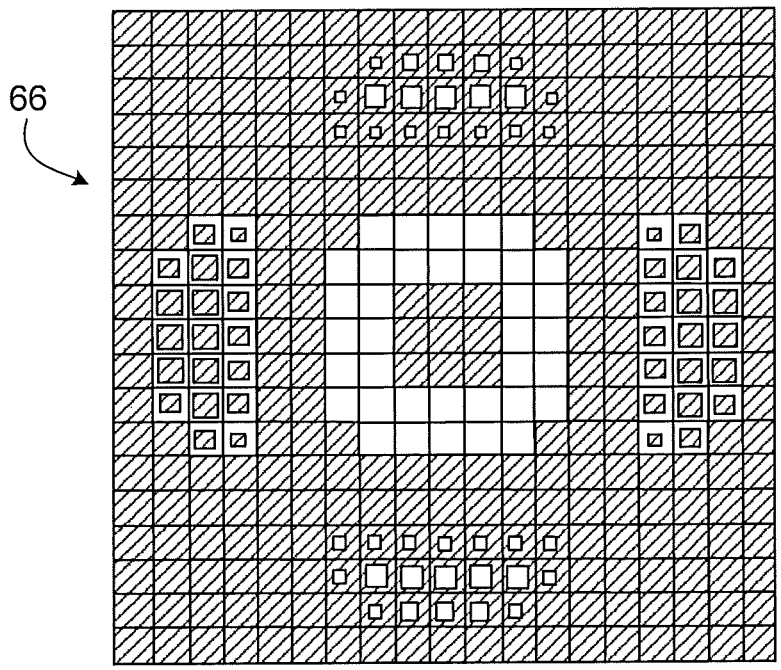
FIG. 7 shows a simplified illustration of a diaphragm.

A simplified example of a diaphragm is shown in FIG. 7. Here the individual pixels are illustrated in a greatly enlarged manner; only a matrix of 19*19 pixels is illustrated. The diaphragm serves for a special illumination setting, of a combination of low-sigma annular and quasar, wherein the respective opposite poles of the quasar have the same intensity, but the two pairs have different intensities. A real diaphragm is represented by a matrix composed of pixels having an edge length of hundreds of pixels, for example 553*553 or 608*608 pixels. The diameter of the circular diaphragm corresponds to the edge length of the matrix, and pixels outside the circle remain unused, i.e. light-opaque.

In a further exemplary embodiment, the pixels have the form of equilateral hexagons arranged in a hexagonal raster. The distance between the pixels from midpoint to midpoint is, as in the first exemplary embodiment, 4.8 μm.

Figure 8:
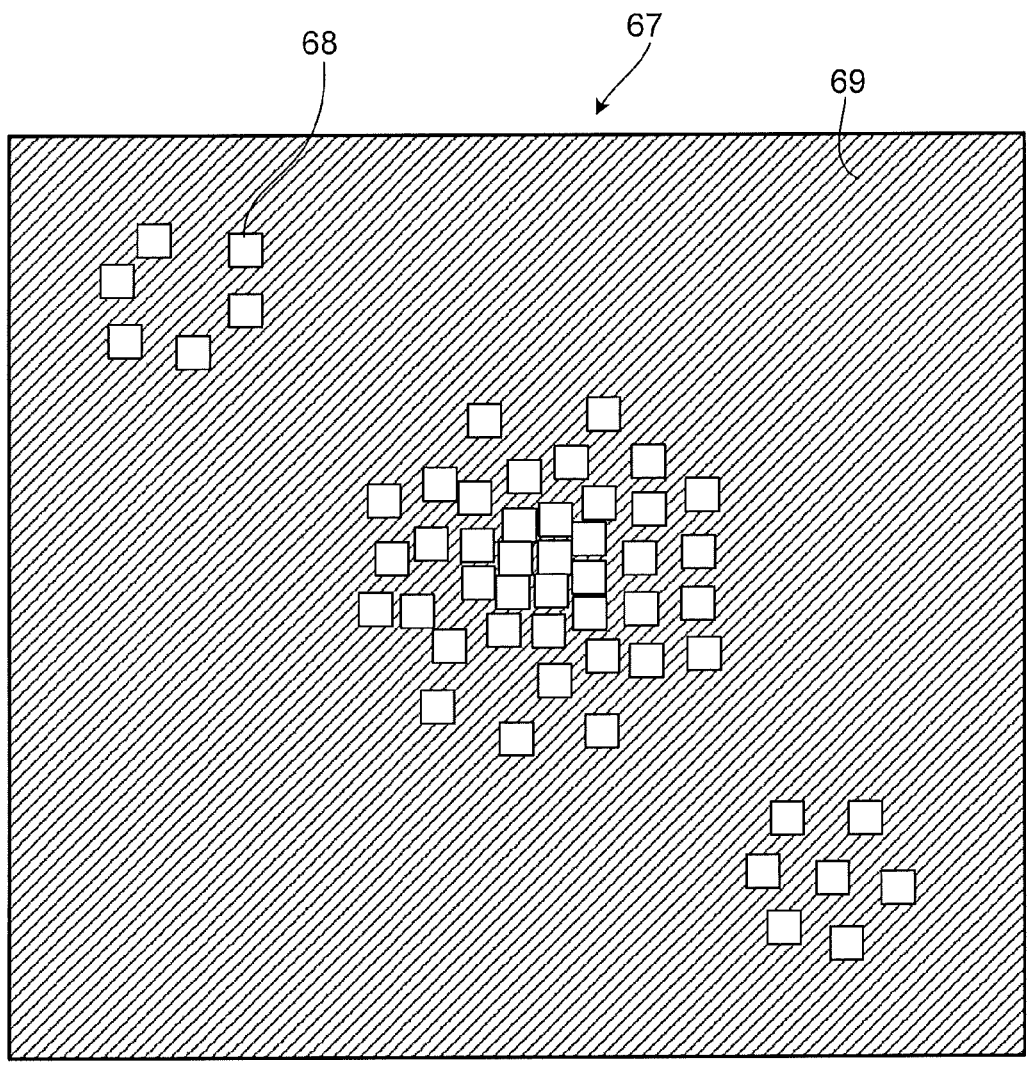
FIG. 8 shows a simplified illustration of a further diaphragm.

In a further exemplary embodiment, the pixels 68 are arranged in a stochastic fashion. The pixels have a constant size. They are embodied as squares having the edge length of 4 μm. The distance between the pixels is variable. It also becomes so large, for example 38 μm, that, as a result of interference of at least two diffraction orders, the pixels are partly imaged in the resultant pupil plane. This is shown schematically in FIG. 8. Here the individual chromium-free pixels 68 in a chromium layer 69 illustrated in hatched fashion are illustrated in a greatly enlarged manner and as not true to scale. The illustration shows a diaphragm 67 for a resultant intensity distribution which has, in the inner area, a radial illumination that decreases in intensity outwards, and two diagonally arranged poles for realizing an average intensity.

In one exemplary embodiment, the desired minimum resolution on the resultant intensity distribution is 1 or 3 pixels per structural feature. The resolution of the pixels on the diaphragm is higher by a factor of two, that is to say two or six pixels per smallest structural feature. In a further exemplary embodiment, the minimum resolution of the resultant intensity distribution is six pixels per structural feature. The resolution of the pixels on the diaphragm is higher by a factor of two, that is to say 12 pixels per smallest structural feature. In a further exemplary embodiment, the minimum resolution of the resultant intensity distribution is 12 pixels per structural feature. The resolution of the pixels on the diaphragm is higher by a factor of ten or twenty, that is to say 120 or 240 pixels per smallest structural feature. The resolution can also vary within a diaphragm.

For producing a diaphragm, in order to convert a resultant intensity distribution, firstly the form and arrangement of, and the distance between, the pixels are selected. A determination is then made as to which of the parameters size and distance are varied in which ranges. It is thus predetermined, for example, that, in the case of square pixels having a fixed distance of p=4.8 μm, arranged in the square raster, the edge length L of the pixels is varied in the range of 0 to 4.8 μm. From the dependence between pixel size and density as determined by calibration mentioned above, the arrangement and size of the pixels to be formed on the diaphragm are then determined from the desired resultant intensity distribution.

During the production of the diaphragm, inhomogeneities of the intensity distribution of the pupil plane can be taken into account and corrected.

For the implementation, all of the diaphragms are removed from the pupil planes; alternatively, an unstructured mask (a "Mask Blanc") is introduced into the pupil plane. The Bertrand lens 185 is introduced into the beam path. The intensities for the pupil are then recorded by means of the detector 200. In order to correct the inhomogeneities, a diaphragm has to reduce all intensity values lying above the smallest intensity value to the minimum value. Instead of an additional diaphragm, this function is effected by the diaphragm to be produced. The resultant intensity distribution that is intended to be achieved by the diaphragm to be produced is corrected for this purpose in such a way that the measured inhomogeneities are compensated for.

A chromium-coated plate of quartz glass is taken as a basis for producing a diaphragm. The previously determined structure is formed on said plate according to the known method for producing masks in lithography.

In a further exemplary embodiment, for varying the intensity distribution in the resultant pupil plane, the transmission of the diaphragm is varied. For this purpose, the diaphragm is coated with a material of variable thickness, which at least partly absorbs or scatters the projection light. The layer thickness is variable; the thicker the layer, the lower the transmission and the lower the resultant intensity. The relationship between resultant intensity and layer thickness is determined by calibration (analogously to the exemplary embodiments mentioned above). The coating is effected with titanium oxide, tantalum oxide, hafnium oxide, chromium, aluminium, gold or silver.

In a further exemplary embodiment, the diaphragm is coated with dielectric reflection layers for varying the transmission.

Layer pairs composed of layers of a material having a high refractive index, e.g. titanium oxide, then having a low refractive index, e.g. magnesium fluoride, are applied to the diaphragm plates. The thickness of the layers can correspond to one quarter of the wavelength of the projection light within the layer. The layer thickness is then $\lambda/(4n_s)$, where $\lambda$ is the wavelength of the projection light in air and $n_s$ is the refractive index of the material of the layer.

The transmission is set by the number of layer pairs or by the variation of the layer thickness.

The relationship between resultant intensity and number of layer pairs or layer thicknesses is determined by calibration (analogously to the exemplary embodiments mentioned above). The coating is effected with different combinations of layers of manganese fluoride, magnesium fluoride, lanthanum fluoride, aluminium fluoride and/or aluminium oxide.

Figure 1A:
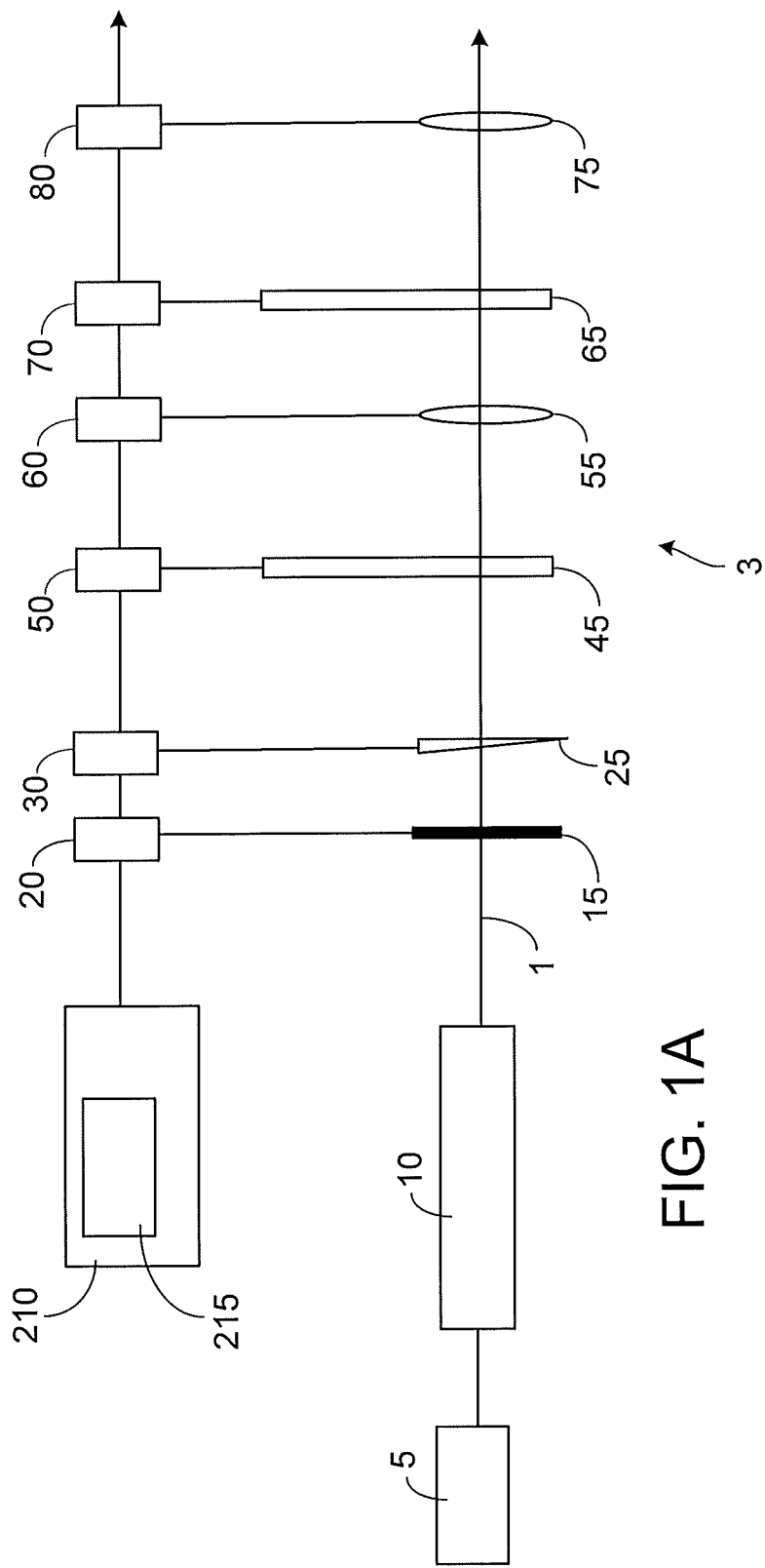
FIG. 1a shows a longitudinal section through a section of an illumination beam path of a mask inspection microscope according to the invention.

In a further configuration of the mask inspection microscope, a plurality of diaphragms are sequentially combined with one another. The illumination beam path illustrated in FIG. 1 is extended, as illustrated in FIG. 1a. The diaphragm plate 45 bears the radius-determining diaphragms 47. The set diaphragm of the radius-determining diaphragms 47 is imaged onto the angle-determining diaphragms 52 of the further diaphragm plate 65 in the desired size by means of a zoom lens 55 with actuating drive 70, said further diaphragm plate likewise being arranged in a pupil plane of the illumination beam path 3. The imaging scale can be varied by a factor of 3. The diaphragm plates are illustrated in FIG. 4; the projection-light-opaque regions are illustrated in hatched fashion. The diaphragm plate 65 is moved laterally by drive 70 in order to introduce a desired diaphragm of the angle-determining diaphragms 67 into the illumination beam path 3. The diaphragm plates 45, 65 are exchangeably connected to the drives 50, 70 by means of quick-acting clamping devices 240. The quick-acting clamping device 240 is part of the drive 50.

By means of a further zoom lens 75 with drive 80, the pupil plane of the diaphragm plate 65 as in the first exemplary embodiment is imaged onto the resultant pupil plane 135 of the condenser 130, as illustrated in FIG. 3.

Examples of a first diaphragm plate 45 and a further diaphragm plate 65 are shown in FIG. 4. Diaphragm plate 45 contains, inter alia, ring-shaped diaphragms 47, having rings of different widths in order to vary the inner and outer coherence or the ratio thereof in the illumination setting. The further diaphragm plate contains, inter alia, angle-determining diaphragms 52. The latter comprise for example alternating light-transmissive and light-opaque sectors. By way of example, diaphragms having two light-opaque sectors lying opposite one another and two light-transmissive sectors lying opposite one another are provided for disars, and diaphragms each having four sectors are provided for quasars. The aperture angles of the sectors can vary.

Both diaphragm plate 45, 65 have a larger aperture 44 that no longer acts as a diaphragm. It is advantageous if only one diaphragm of a diaphragm plate 45, 65 is intended to be utilized.

The continuation of the illumination beam path 3 corresponds to that of the first exemplary embodiment.

Figure 2:
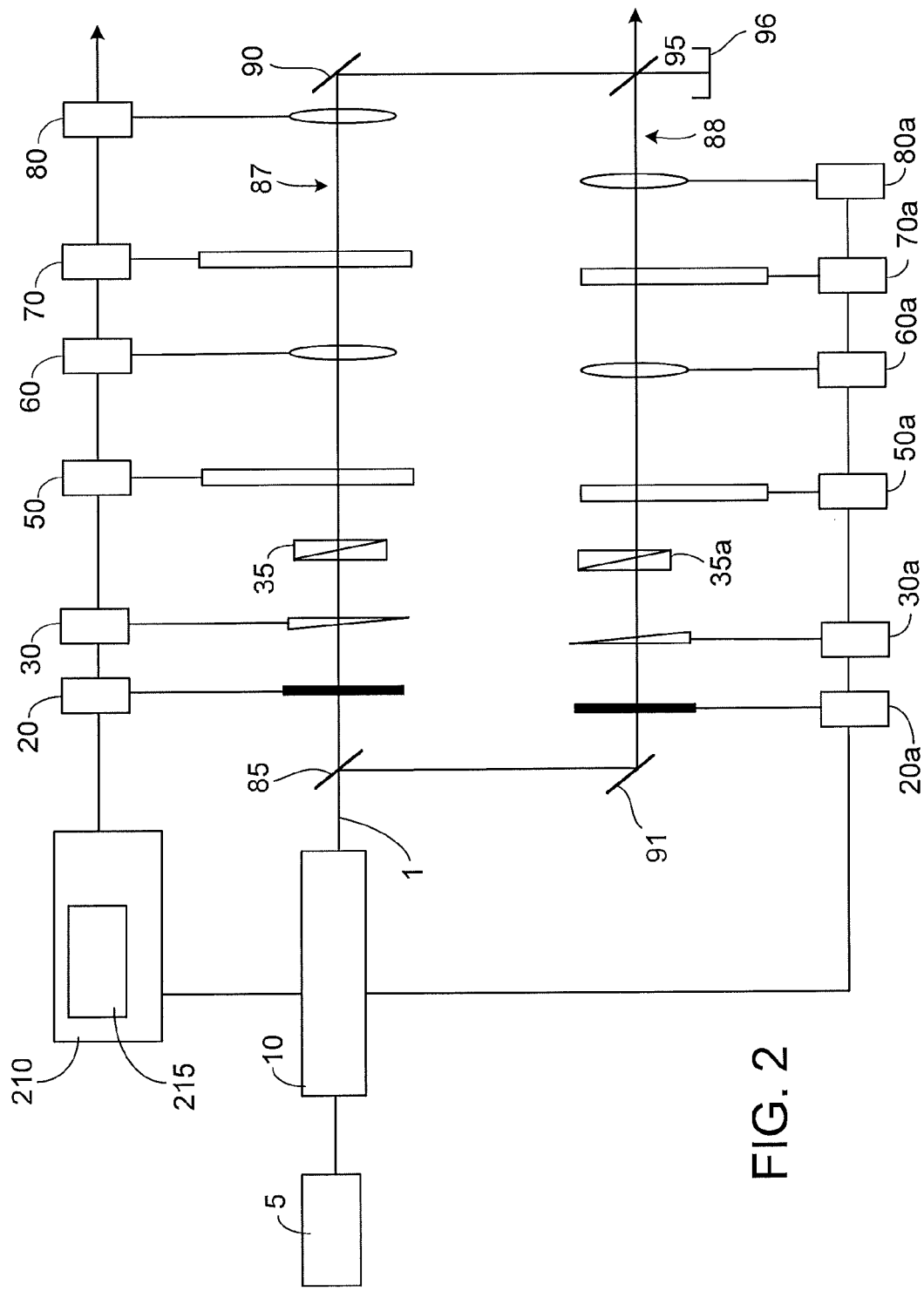
FIG. 2 shows a longitudinal section through a section of two illumination beam paths of a mask inspection microscope according to the invention.

In a further configuration of the invention, the illumination beam path 3 is split into a first illumination beam path 87 and a second illumination beam path 88 by means of a polarization-independent beam splitter 85, as illustrated in FIG. 2. The illumination beam paths 87 and 88 are recombined to form illumination beam path 3 by means of a further polarization-independent beam splitter 95. The mirrors 90 and 91 direct the projection light in the necessary directions. Beam blocker 96 absorbs the non-utilizable proportion of the projection light from beam splitter 95.

The first illumination beam path 87 is constructed analogously to the illumination beam path 3 of the first exemplary embodiment. Identical elements in the corresponding sections bear identical reference signs. It comprises shutter 15, attenuator 25, first diaphragm plate 45, zoom lens 55, further diaphragm plate 65 and zoom lens 75. In addition, a deflection mirror 90 is arranged in such a way that the projection light is directed onto the polarization-independent beam splitter 95.

The second illumination beam path 87 is also constructed analogously to the illumination beam path 3 of the first exemplary embodiment. Identical elements in the corresponding sections bear identical reference signs supplemented by "a". It comprises shutter 15a, attenuator 25a, first diaphragm plate 45a, zoom lens 55a, further diaphragm plate 65a and zoom lens 75a and the respective drives 20, 30, 50, 70, 80, 20a, 30a, 50a, 70a, 80a.

As described in the first exemplary embodiment, the zoom lenses can be replaced by lenses having a fixed imaging scale.

A $\lambda/2$ plate 35/35a is introduced as required into each of the two illumination beam paths 87, 88 in the region between the polarization-independent beam splitters 85 and 95, in order to eliminate undesired polarizations of the projection light which arise as a result of reflection of the projection light at the beam splitter 85 and 95.

In a further exemplary embodiment, X/Y-polarizing beam splitters 85 and 95 are used in a targeted manner, and the $\lambda/2$ plates 35/35a are then obviated. Thus, the beam splitter 85 provides X-polarized light in the illumination beam path 87 and Y-polarized light in the illumination beam path 88 (or vice versa). The illumination beam paths are then recombined in a manner virtually free of losses by the correspondingly oriented X/Y-polarizing beam splitter 95 and the respective polarizations are maintained. The beam blocker 96 is obviated here.

The further course of the illumination beam path 3 is, as illustrated in FIG. 3, identical to that described in the first exemplary embodiment.

As in the first exemplary embodiment, all the drives 20, 30, 50, 60, 70, 80, 20a, 30a, 50a, 60a, 70a, 80a, 115, 125, 142, 182, 190, 185 and the detector 200 are connected to a data processing system 210 with input and output unit 215.

In a further exemplary embodiment (not illustrated), two polarizers 110 and 120 for linear and respectively tangential polarization of the projection light with the drives 115 and 125 are arranged in each illumination beam path 87, 88. Beam splitter 95 is then arranged downstream of said polarizers 110, 120 in order to combine the illumination beam paths 87, 88.

All the diaphragm plates 45, 45a, 65, 65a have a larger aperture 44 that no longer acts as a diaphragm. This is advantageous if the corresponding diaphragm plate is not intended to be utilized, since it does not have to be demounted. Thus, provision is made of specific diaphragms for illumination settings, e.g. 48, 49, which can be assembled from a plurality of diaphragms only in an elaborate manner.

The diaphragm plates 45, 65 of the first illumination beam path 87 can be identical to those of the first exemplary embodiment. The illumination settings thus obtained can then be altered further by the diaphragms of the diaphragm plates 45a, 65a of the second illumination beam path 88.

If disars rotated about the optical axis 1 by 90° with respect to one another are set in the two illumination beam paths 87, 88, as described in the first exemplary embodiment, then the resultant intensity distribution of the pupil plane is a quasar. A quadrupole can also be set by means of the dipoles 54 and 54a rotated about the optical axis 1 by 90° with respect to one another on the parallel diaphragm plates 45 and 45a. The intensities of the opposite poles of the quasar or quadrupole can then be set by the attenuators 25, 25a.

If a quasar is set in the first illumination beam path 87, as described in the first exemplary embodiment, then the central region can additionally be illuminated circularly e.g. by means of the second illumination beam path 88.

The gradient of the resultant intensity distribution of the pupil plane can be decreased if the same form of illumination setting as in the first illumination beam path 87, but with a different extent, is set in the second illumination beam path 88. For this purpose, diaphragms with correspondingly different extents are provided on the diaphragm plates 45 and 45a and respectively 65 and 65a that are used in parallel. Thus, by way of example, two quadrupoles 46, 46a are provided on the diaphragm plates 45 and 45a. The position of the midpoints of the poles is identical; the diameter of the poles differs slightly. The resultant intensity distribution leads to a higher intensity in the region of the superposition of the two diaphragms than in the edge region of the poles, which is covered only by one diaphragm. The intensity distribution of the superposed quadrupoles can be varied by the attenuators 25, 25a.

The illumination beam paths 87, 88 can also be completely masked out by the shutters 15, 15a.

It is the case also for adjusting the diaphragms from one of the illumination beam paths 87, 88 that the respective other path can be masked out by one of the shutters 15, 15a.

In a further exemplary embodiment, which is not illustrated in the drawings, two diaphragm plates (45, 65) are arranged in a pupil plane. The diaphragm plates are moveable with respect to one another and can thus be moved by a drive both perpendicularly to the illumination beam path and with respect to one another. Consequently, the individual diaphragms arranged on the diaphragm plates (45, 65) can be introduced into the illumination beam path in any desired combinations by means of corresponding drives. The configuration of the diaphragm plates (45, 65) and the combination possibilities therefor correspond to those of the first exemplary embodiment.

When a diaphragm plate is inserted into the mask inspection microscope, the position of the diaphragm plate 45, 45a, 65, 65a within the illumination beam path 3, 87, 88 is stored in the data processing system 210.

Diaphragm plates 45 and 45a and respectively 65 and 65a each have a machine-readable marking 71a, 71b, 71c and 71d. The latter are embodied as text or as barcode. These are firstly imaged via the Bertrand lens 185 on the detector 200. The position of said markings is predetermined in the data processing system 210. The markings are evaluated by the data processing system 210. By means of character recognition (OCR) or evaluation of the barcode, from the marking the designation of a data record with information about position and properties of the diaphragms of said diaphragm plate 45, 45a, 65, 65a is identified and assigned. For each of the diaphragm plates 45 and 45a and respectively 65 and 65a, a data record is then read in.

The position of a diaphragm is defined by specifying in each data record the coordinates of the midpoints of the individual diaphragms proceeding from a reference point on the diaphragm plate 45, 65, 45a, 65a. The outer and inner degrees of coherence or the aperture angles or positions and diameters of poles of the diaphragms are additionally specified. The complete form, resultant intensity distribution and a graphical representation of each diaphragm is also given.

By means of the data processing system 210, diaphragms of a diaphragm plate 45, 45a, 65, 65a can be selected in a targeted manner and can be introduced into the illumination beam path 3, 87, 88 by movement of the respective diaphragm plate 45, 65, 45a. Any desired diaphragm combinations can be selected and set in this way. The imaging scales of the zoom lenses 55, 75 and, if appropriate, 55a and 75a, and also the positions of the polarizers 110 and 120 and attenuators 25, 25a are also set by means of the data processing system 210.

The illumination settings resulting from the combination of the different diaphragms are then determined by the data processing system 210. The fact of whether the diaphragm plates 45, 65, 45a are combined sequentially or in parallel is determined by the positions predetermined upon insertion of the diaphragm plates in the mask inspection microscope. The resultant intensity distributions are represented graphically and the abovementioned parameters for their characterization, such as e.g. inner and outer coherence, are specified. The contributions of the individual diaphragms are represented in different colours. The possible imaging scales can be predetermined by the user by means of the zoom lenses 55, 75 and, if appropriate, 55a and 75a. The combinations given maximum and minimum setting of the imaging scales are then represented or fixed imaging scales can be predetermined by the user.

The user can then select one of the possible illumination settings via the input and output unit 215. In addition, the user inputs the desired settings of the polarizers and attenuators via the input and output unit 215. The shutters 15, 15a, attenuators 25, 25a, diaphragm plates 45, 65, 45a and polarizers 110, 120 are then set by the data processing system 215 via the drives 20, 30, 50, 70, 80, 20a, 30a, 50a, 70a, 80a, 115 in such a way that the desired illumination setting results.

The invention claimed is:

1. A mask inspection microscope for generating an image of the structure of a reticle, arranged in an object plane, in a field plane of the mask inspection microscope, comprising
a light source that emits projection light along at least one illumination beam path, and
a diaphragm, arranged in a pupil plane of the mask inspection microscope, for generating a resultant intensity distribution of the projection light in a pupil plane of the illumination beam path,
wherein the diaphragm is embodied in such a way that the resultant intensity distribution of the projection light has at least one further intensity value between a minimum and a maximum intensity value,
wherein the diaphragm has at least one region which is composed of light-transmissive and light-opaque pixels, such that the at least one further intensity value is formed by said at least one region, and
wherein the distance between the pixels is embodied in such a way that only the zeroth diffraction order of the projection light diffracted at the diaphragm contributes to the at least one further intensity value.

2. The mask inspection microscope according to claim 1, wherein the at least one region is embodied as a light-transmissive region on which light-opaque pixels are arranged.

3. The mask inspection microscope according to claim 1, wherein the at least one region is embodied as a light-opaque region on which light-transmissive pixels are arranged.

4. The mask inspection microscope according to claim 1, which comprises a field stop that stops down projection light of higher diffraction orders that is diffracted at the diaphragm.

5. The mask inspection microscope according to claim 1, wherein the resolution of the pixels on the diaphragm is at least two pixels per smallest structural feature.

6. The mask inspection microscope according to claim 1, wherein the at least one further intensity value is varied by the size of the pixels.

7. The mask inspection microscope according to claim 1, wherein the at least one further intensity value is varied by the distance between the pixels.

8. The mask inspection microscope according to claim 1, wherein the pixels are arranged stochastically on the diaphragm.

9. The mask inspection microscope according to claim 1, wherein the pixels are embodied in square fashion.

10. The mask inspection microscope according to claim 1, wherein the diaphragm has a transmission that varies in a location-dependent manner for the projection light, such that the at least one further intensity value is formed.

11. The mask inspection microscope according to claim 1, wherein the diaphragm has at least one absorber layer for varying the transmission.

12. The mask inspection microscope according to claim 1, wherein the diaphragm has at least one dielectric reflection layer for varying the transmission.

13. The mask inspection microscope according to claim 1, wherein at least two diaphragms are arranged on a diaphragm plate, such that the individual diaphragms are changed by the movement of the diaphragm plate.

14. The mask inspection microscope according to claim 1, wherein the diaphragm plate is connected to a drive by a quick-acting clamping device.

15. The mask inspection microscope according to claim 1, wherein a data record having information about positions of the diaphragms on the diaphragm plate is present with respect to each diaphragm plate.

16. The mask inspection microscope according to claim 1, wherein a data record having information about properties of the diaphragms is present with respect to each diaphragm plate.

17. The mask inspection microscope according to claim 1, wherein a data processing system is provided, which determines possible illumination settings with respect to predetermined diaphragm plates.

18. The mask inspection microscope according to claim 1, wherein at least one polarizer is arranged in the illumination beam path.

19. The mask inspection microscope according to claim 1, wherein at least one of the polarizers linearly polarizes the projection light.

20. The mask inspection microscope according to claim 1, wherein at least one of the polarizers polarizes the linearly polarized projection light at least in sections tangentially with respect to the optical axis of the illumination beam path.

21. The mask inspection microscope according to claim 1, wherein the resultant intensity distribution of the projection light of the pupil plane that is optically conjugate with respect to the object plane is influenced by a plurality of diaphragms.

22. The mask inspection microscope according to claim 21, wherein at least two diaphragms are arranged along an illumination beam path.

23. The mask inspection microscope according to claim 22, wherein at least two diaphragms are arranged in different pupil planes.

24. The mask inspection microscope according to claim 21, wherein at least two diaphragms are arranged jointly in one of the pupil planes.

25. The mask inspection microscope according to claim 21, wherein at least one first set of the diaphragms is configured in such a way that the radius-dependent intensity distribution of the projection light and at least one second set of the diaphragms is configured in such a way that the angle-dependent intensity distribution of the projection light is determined in the pupil planes that is optically conjugate with respect to the object plane.

26. The mask inspection microscope according to claim 21, wherein the at least one illumination beam path, for splitting the projection light, is split at least in sections into at least two illumination beam paths and at least one diaphragm is arranged in each of the illumination beam paths.

27. The mask inspection microscope according to claim 26, wherein the illumination beam paths are recombined upstream of the object plane.

28. The mask inspection microscope according to claim 26, wherein polarization converters for the elimination of undesired polarization of the projection light are arranged in at least one of the illumination beam paths.

29. The mask inspection microscope according to claim 26, wherein at least two of the diaphragms influence the intensity distribution of the pupil plane at different locations.

30. The mask inspection microscope according to claim 26, wherein at least one polarizer is arranged in each of the illumination beam paths.

31. The mask inspection microscope according to claim 26, wherein the projection light is split between the illumination beam paths to the extent of identical portions in each case.

32. The mask inspection microscope according to claim 26, wherein an attenuator is arranged in at least one of the illumination beam paths.

33. The mask inspection microscope according to claim 26, wherein a shutter is arranged in at least one of the illumination beam paths.

34. The mask inspection microscope according to claim 21, wherein at least one zoom lens is arranged in the at least one illumination beam path, a pupil plane of the at least one illumination beam path being imaged in variable size onto at least one further pupil plane of the illumination beam path by means of said at least one zoom lens.

35. A diaphragm for use in a pupil plane of a mask inspection microscope comprising: a light source that emits projection light and at least one illumination beam path for generating an image of the structure of a reticle arranged in an object plane in a field plane of the mask inspection microscope, wherein the diaphragm is embodied in such a way that a resultant intensity distribution of the projection light can be generated in a pupil plane of the illumination beam path that is optically conjugate with respect to the object plane, wherein the diaphragm is embodied in such a way that the resultant intensity distribution of the projection light has at least one further intensity value between a minimum and a maximum intensity value, wherein the diaphragm has at least one region which is composed of light-transmissive and light-opaque pixels, such that the at least one further intensity value is formed by said at least one region, and wherein the distance between the pixels is embodied in such a way that only the zeroth diffraction order of the projection light diffracted at the diaphragm contributes to the at least one further intensity value.

36. The diaphragm according to claim 35, wherein the at least one region is embodied as a light-transmissive region on which light-opaque pixels are arranged.

37. The diaphragm according to claim 35, wherein the at least one region is embodied as a light-opaque region on which light-transmissive pixels are arranged.

38. The diaphragm according to claim 35, wherein the resolution of the pixels on the diaphragm is at least two pixels per smallest structural feature.

39. The diaphragm according to claim 35, wherein the at least one further intensity value is varied by the size of the pixels.

40. The diaphragm according to claim 35, wherein the at least one further intensity value is varied by the distance between the pixels.

41. The diaphragm according to claim 35, wherein the pixels are arranged stochastically on the diaphragm.

42. The diaphragm according to claim 35, wherein the pixels are embodied in square fashion.

43. The diaphragm according to claim 35, wherein the diaphragm has a transmission that varies in a location-dependent manner for the projection light, such that the at least one further intensity value is formed.

44. The diaphragm according to claim 43, wherein the diaphragm has at least one absorber layer for varying the transmission.

45. The diaphragm according to claim 43, wherein the diaphragm has at least one dielectric reflection layer for varying the transmission.

46. A method for producing a diaphragm for use in a pupil plane of a mask inspection microscope comprising: a light source that emits projection light and at least one illumination beam path for generating an image of the structure of a reticle arranged in an object plane in a field plane of the mask inspection microscope, wherein the diaphragm is embodied in such a way that a resultant intensity distribution of the projection light can be generated in a pupil plane of the illumination beam path that is optically conjugate with respect to the object plane, wherein the diaphragm is embodied in such a way that the resultant intensity distribution of the projection light has at least one further intensity value between a minimum and a maximum intensity value, the method comprising the following steps:
predetermining the intensity values of the resultant intensity distribution of the projection light which are to be realized by the diaphragm to be produced;
converting the intensity values into positions and sizes of the light-transmissive and light-opaque pixels that are to be arranged on the diaphragm; and
producing the diaphragm.

47. The method for producing a diaphragm for use in a mask inspection microscope according to claim 46, wherein the relationship between the resultant intensity-values and positions and/or sizes of the pixels is determined by calibration.

48. The method for producing a diaphragm for use in a mask inspection microscope according to claim 46, comprising the following steps:
measuring the intensity distribution of the projection light in the pupil plane without a diaphragm;
calculating required corrections of the predetermined intensity values in order to compensate for inhomogeneities of the measured intensity distribution; and
correcting the predetermined intensity values.

49. A mask inspection microscope for generating an image of the structure of a reticle, arranged in an object plane, in a field plane of the mask inspection microscope, comprising:
a light source that emits projection light along at least one illumination beam path,
a diaphragm, arranged in a pupil plane of the mask inspection microscope, for generating a resultant intensity distribution of the projection light in a pupil plane of the illumination beam path, and
a field stop that stops down projection light of higher diffraction orders that is diffracted at the diaphragm,
wherein the diaphragm is embodied in such a way that the resultant intensity distribution of the projection light has at least one further intensity value between a minimum and a maximum intensity value, and
wherein the diaphragm has at least one region which is composed of light-transmissive and light-opaque pixels, such that the at least one further intensity value is formed by said at least one region.

50. A mask inspection microscope for generating an image of the structure of a reticle, arranged in an object plane, in a field plane of the mask inspection microscope, comprising
a light source that emits projection light along at least one illumination beam path, and
a diaphragm, arranged in a pupil plane of the mask inspection microscope, for generating a resultant intensity distribution of the projection light in a pupil plane of the illumination beam path,
wherein the diaphragm is embodied in such a way that the resultant intensity distribution of the projection light has at least one further intensity value between a minimum and a maximum intensity value,
wherein the diaphragm has at least one region which is composed of light-reflective and non-reflective pixels, such that the at least one further intensity value is formed by said at least one region, and
wherein the distance between the pixels is embodied in such a way that only the zeroth diffraction order of the projection light diffracted at the diaphragm contributes to the at least one further intensity value.

51. A mask inspection microscope for generating an image of the structure of a reticle, arranged in an object plane, in a field plane of the mask inspection microscope, comprising:
a light source that emits projection light along at least one illumination beam path,
a diaphragm, arranged in a pupil plane of the mask inspection microscope, for generating a resultant intensity distribution of the projection light in a pupil plane of the illumination beam path, and
a field stop that stops down projection light of higher diffraction orders that is diffracted at the diaphragm,
wherein the diaphragm is embodied in such a way that the resultant intensity distribution of the projection light has at least one further intensity value between a minimum and a maximum intensity value, and
wherein the diaphragm has at least one region which is composed of light-reflective and non-reflective pixels, such that the at least one further intensity value is formed by said at least one region.

* * * * *

UNITED STATES PATENT AND TRADEMARK OFFICE
CERTIFICATE OF CORRECTION

| | |
|---|---|
| PATENT NO. | : 8,970,951 B2 |
| APPLICATION NO. | : 13/391996 |
| DATED | : March 3, 2015 |
| INVENTOR(S) | : Ulrich Matejka et al. |

It is certified that error appears in the above-identified patent and that said Letters Patent is hereby corrected as shown below:

In the Specification

Column 19

Line 54, delete "plate" and insert -- plate 65 --

Signed and Sealed this
Fourteenth Day of July, 2015

Michelle K. Lee
*Director of the United States Patent and Trademark Office*